(12) United States Patent
Ohnuma et al.

(10) Patent No.: US 8,101,501 B2
(45) Date of Patent: Jan. 24, 2012

(54) METHOD OF MANUFACTURING SEMICONDUCTOR DEVICE

(75) Inventors: Hideto Ohnuma, Atsugi (JP); Yoichi Iikubo, Machida (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 304 days.

(21) Appl. No.: 12/240,186

(22) Filed: Sep. 29, 2008

(65) Prior Publication Data

US 2009/0098709 A1 Apr. 16, 2009

(30) Foreign Application Priority Data

Oct. 10, 2007 (JP) .................................. 2007-264051

(51) Int. Cl.
*H01L 21/46* (2006.01)

(52) U.S. Cl. ........ 438/458; 438/311; 438/475; 438/197; 438/680; 438/692; 257/E21.568; 257/E21.17; 257/E21.218; 257/E21.229

(58) Field of Classification Search .................. 438/458, 438/311, 475, 197, 680, 692, 510, 535, 663, 438/706, 723–724; 257/E21.568, E21.17, 257/E21.218, E21.229, E21.227, E21.278
See application file for complete search history.

(56) References Cited

U.S. PATENT DOCUMENTS

| 5,374,564 | A | * | 12/1994 | Bruel | 438/455 |
|---|---|---|---|---|---|
| 5,466,303 | A | * | 11/1995 | Yamaguchi et al. | 148/33 |
| 6,121,117 | A | * | 9/2000 | Sato et al. | 438/459 |
| 6,127,702 | A | | 10/2000 | Yamazaki et al. | |
| 6,191,007 | B1 | * | 2/2001 | Matsui et al. | 438/459 |
| 6,271,101 | B1 | | 8/2001 | Fukunaga | |
| 6,335,231 | B1 | | 1/2002 | Yamazaki et al. | |
| 6,372,609 | B1 | | 4/2002 | Aga et al. | |
| 6,380,046 | B1 | | 4/2002 | Yamazaki | |
| 6,388,652 | B1 | | 5/2002 | Yamazaki et al. | |

(Continued)

FOREIGN PATENT DOCUMENTS

EP   1 045 448   10/2000

(Continued)

OTHER PUBLICATIONS

Chinese Office Action (Application No. 200810166515.3) Dated Jun. 13, 2011.

*Primary Examiner* — N Drew Richards
*Assistant Examiner* — Ankush Singal
(74) *Attorney, Agent, or Firm* — Eric J. Robinson; Robinson Intellectual Property Law Office, P.C.

(57) ABSTRACT

To provide a method of manufacturing a semiconductor device, which prevents impurities from entering an SOI substrate. A source gas including one or plural kinds selected from a hydrogen gas, a helium gas, or halogen gas are excited to generate ions, and the ions are added to a bonding substrate to thereby form a fragile layer in the bonding substrate. Then, a region of the bonding substrate that is on and near the surface thereof, i.e., a region ranging from a shallower position than the fragile layer to the surface is removed by etching, polishing, or the like. Next, after attaching the bonding substrate to a base substrate, the bonding substrate is separated at the fragile layer to thereby form a semiconductor film over the base substrate. After forming the semiconductor film over the base substrate, a semiconductor element is formed using the semiconductor film.

20 Claims, 16 Drawing Sheets

U.S. PATENT DOCUMENTS

| | | | |
|---|---|---|---|
| 6,468,923 B1 | 10/2002 | Yonehara et al. | |
| 6,534,380 B1* | 3/2003 | Yamauchi et al. | 438/455 |
| 6,602,761 B2 | 8/2003 | Fukunaga | |
| 6,653,209 B1* | 11/2003 | Yamagata | 438/459 |
| 6,686,623 B2 | 2/2004 | Yamazaki | |
| 6,778,164 B2 | 8/2004 | Yamazaki et al. | |
| 6,803,264 B2* | 10/2004 | Yamazaki et al. | 438/151 |
| 6,875,633 B2 | 4/2005 | Fukunaga | |
| 6,893,936 B1* | 5/2005 | Chen et al. | 438/407 |
| 6,900,113 B2* | 5/2005 | Nakano et al. | 438/455 |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,229,899 B2* | 6/2007 | Moriceau et al. | 438/458 |
| 7,253,069 B2* | 8/2007 | Murakami et al. | 438/311 |
| 7,256,776 B2 | 8/2007 | Yamazaki et al. | |
| 7,279,400 B2* | 10/2007 | Maa et al. | 438/458 |
| 7,449,395 B2* | 11/2008 | Allibert et al. | 438/459 |
| 7,459,375 B2* | 12/2008 | Maa et al. | 438/455 |
| 7,601,613 B2* | 10/2009 | Mitani | 438/455 |
| 7,632,739 B2* | 12/2009 | Hebras | 438/456 |
| 7,867,877 B2* | 1/2011 | Morita et al. | 438/459 |
| 2001/0007367 A1* | 7/2001 | Ohkubo | 257/347 |
| 2003/0153162 A1* | 8/2003 | Nakano et al. | 438/458 |
| 2003/0181001 A1* | 9/2003 | Aga et al. | 438/200 |
| 2003/0219957 A1* | 11/2003 | Kuwabara et al. | 438/400 |
| 2004/0104424 A1 | 6/2004 | Yamazaki | |
| 2004/0150006 A1* | 8/2004 | Aulnette et al. | 257/200 |
| 2004/0180512 A1* | 9/2004 | Linn et al. | 438/458 |
| 2005/0009252 A1 | 1/2005 | Yamazaki et al. | |
| 2006/0040469 A1* | 2/2006 | Aga et al. | 438/458 |
| 2006/0128075 A1 | 6/2006 | Kwon | 438/149 |
| 2006/0189083 A1* | 8/2006 | Saenger et al. | 438/275 |
| 2006/0234461 A1* | 10/2006 | Nishihata et al. | 438/365 |
| 2007/0023066 A1* | 2/2007 | Yokokawa et al. | 134/1.3 |
| 2007/0063281 A1 | 3/2007 | Takafuji et al. | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |
| 2008/0171443 A1* | 7/2008 | Hebras | 438/703 |
| 2008/0286937 A1* | 11/2008 | Mitani | 438/458 |
| 2009/0309183 A1* | 12/2009 | Yamazaki et al. | 257/506 |

FOREIGN PATENT DOCUMENTS

| | | |
|---|---|---|
| EP | 1780794 A | 5/2007 |
| JP | 11-163363 | 6/1999 |
| JP | 2000-124092 | 4/2000 |
| JP | 2001-168308 | 6/2001 |
| JP | 2004-087606 | 3/2004 |
| WO | WO-2005/124865 | 12/2005 |

* cited by examiner

METHOD OF MANUFACTURING SEMICONDUCTOR DEVICE

BACKGROUND OF THE INVENTION

1. Field of the Invention

The present invention relates to a method of manufacturing a semiconductor device with use of an SOI (silicon on insulator) substrate. The present invention particularly relates to a bonding SOI technique, and also to a method of manufacturing a semiconductor device with the use of an SOI substrate obtained by attaching a single crystal or polycrystalline semiconductor film to a substrate with an insulating film interposed between the semiconductor film and the substrate.

2. Description of the Related Art

Demands for higher integration, higher operation speed, higher performance, and lower power consumption have been more stringent, and in response to such demands, a transistor using an SOI substrate has attracted attention as an effective means that can take the place of a bulk transistor. Higher operation speed and lower power consumption can be expected more in the transistor using the SOI substrate than in the bulk transistor because an insulating film is formed over a semiconductor film in the transistor using the SOI substrate, and accordingly parasitic capacitance can be reduced and generation of leakage current flowing through the substrate can be suppressed. In addition, since the semiconductor film used as an active layer can be formed thin, a short channel effect can be suppressed; thus, an element can be miniaturized and higher integration of a semiconductor integrated circuit can be realized accordingly.

As one method of manufacturing an SOI substrate, a method is given in which a semiconductor film is attached to a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described attaching methods make it possible to form over an inexpensive glass substrate, a high-performance integrated circuit which uses a single crystal semiconductor film.

For example, Patent Document 1 (Japanese Published Patent Application No. 2004-087606) has disclosed a method of manufacturing an SOI substrate by attaching to a glass substrate, a semiconductor film separated from a bulk semiconductor substrate.

SUMMARY OF THE INVENTION

In order to separate a thin semiconductor film from a bulk semiconductor substrate, it is necessary to form a fragile layer including a plurality of very small voids by introduction of hydrogen ions to the semiconductor substrate. By performing heat treatment on the semiconductor substrate after the formation of the fragile layer, the semiconductor substrate can be separated at the fragile layer, so that the thin semiconductor film is separated. The introduction of hydrogen ions is generally performed by an ion implantation method. In an ion implantation method, a source gas is made into plasma, ion species included in this plasma are extracted and mass-separated, ion species with predetermined mass are accelerated, and an object is irradiated with the accelerated ion species as an ion beam.

The research by SEL (Semiconductor Energy Laboratory Co., Ltd.) indicates that, in the case of forming a fragile layer by an ion doping method, a semiconductor substrate can be separated by heat treatment performed at lower temperatures than a strain point of a glass substrate. In an ion doping method, a source gas is made into plasma, ion species included in this plasma are extracted by an operation of a predetermined electric field, the extracted ion species are accelerated without being mass-separated, and an object is irradiated with the accelerated ion species as an ion beam. By formation of the fragile layer in accordance with the ion doping method based on this knowledge, an SOI substrate can be manufactured using a glass substrate whose strain point is 700° C. or lower.

In addition, the ion doping method has an advantage in that the takt time in forming the fragile layer is short because ions are accelerated by an electric field without being mass-separated and introduced to the semiconductor substrate. Therefore, it can be said that the ion doping method is preferable particularly when the takt time is expected to be long, for example, when a plurality of semiconductor substrates is irradiated with hydrogen ions or when a large-sized semiconductor substrate is irradiated with hydrogen ions.

Despite the advantage of short takt time, the ion doping method has a risk that impurities such as a metal element included in a material of an electrode in an ion doping apparatus are introduced to the semiconductor substrate together with hydrogen ions because mass separation is not performed. Since the above impurities are included in an SOI substrate to be completed finally, a semiconductor device manufactured using the SOI substrate tends to have lower reliability and lower electrical characteristics of transistors, such as variation in threshold voltage and increase in leakage current. Moreover, the ion doping method easily causes particles, and moreover easily causes defects in attaching a bonding substrate (semiconductor substrate) and a base substrate to each other because of the particles.

In view of the aforementioned problems, it is an object of the present invention to provide a method of manufacturing a semiconductor device, which can prevent impurities from entering an SOI substrate.

In an aspect of a method of manufacturing a semiconductor device of the present invention made in order to solve the aforementioned problems, a fragile layer is formed in a bonding substrate (semiconductor substrate) in such a manner that ions are generated by exciting a source gas including one or plural kinds of gases selected from a hydrogen gas, a helium gas, or a halogen gas and the ions are added to the bonding substrate. Then, a region on and near a surface of the bonding substrate, that is, a region of the bonding substrate ranging from a shallower position than the fragile layer to the surface of the bonding substrate is removed by etching, polishing, or the like. Next, the bonding substrate and a base substrate are attached to each other and then the bonding substrate is separated at the fragile layer; thus, a semiconductor film is formed over the base substrate.

In an aspect of a method of manufacturing a semiconductor device of the present invention made in order to solve the aforementioned problems, an insulating film is formed over a bonding substrate (semiconductor substrate), and then a fragile layer is formed in the bonding substrate in such a manner that ions are generated by exciting a source gas including one or plural kinds of gases selected from a hydrogen gas, a helium gas, or a halogen gas and the ions are added to the bonding substrate through the insulating film. Then, a region of the insulating film ranging from the surface of the insulating film to a predetermined depth is removed by etching, polishing, or the like. Next, the bonding substrate and a base substrate are attached to each other to sandwich the etched insulating film, and then the bonding substrate is separated at the fragile layer; thus, a semiconductor film is formed over the base substrate.

In another aspect of the present invention, after the formation of the semiconductor film over the base substrate, a semiconductor element is formed using the semiconductor film.

In the present invention, after the formation of the fragile layer, a region on and near the surface of the insulating film where impurity contamination or adhesion of particles is remarkable is removed by etching, polishing, or the like. Therefore, the amount of impurities which enter the semiconductor film over the base substrate can be suppressed. In the semiconductor device which is completed finally with the use of the base substrate over which the semiconductor film is formed, it is possible to prevent the impurities from causing decrease in reliability and decrease in electrical characteristics of transistors, such as variation in threshold voltage or increase in leakage current.

Moreover, in the present invention, a region on and near the surface of the bonding substrate, where impurity contamination is remarkable, is removed by etching, polishing, or the like after the formation of the fragile layer. Therefore, the amount of impurities which enter the semiconductor film over the base substrate can be suppressed. In the semiconductor device which is completed finally with the use of the base substrate over which the semiconductor film is formed, it is possible to prevent the impurities from causing decrease in reliability and decrease in electrical characteristics of transistors, such as variation in threshold voltage or increase in leakage current.

DETAILED DESCRIPTION OF THE INVENTION

Figure 1A:
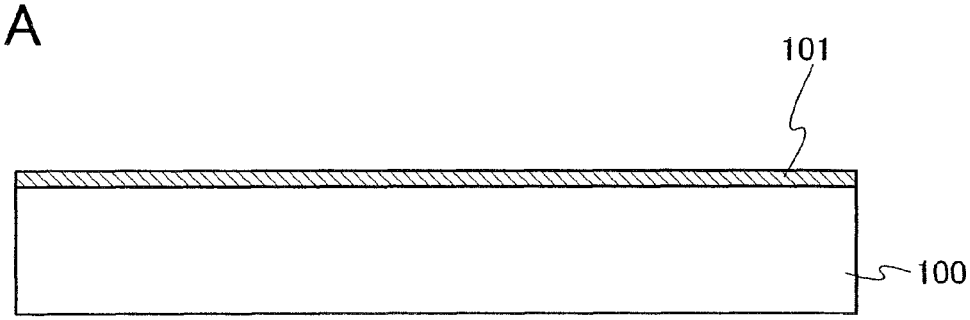
FIGS. 1A to 1D show a method of manufacturing a semiconductor device of the present invention.

Embodiment Modes of the present invention will hereinafter be described with reference to the drawings. However, since the present invention can be carried out in many different modes, it is easily understood by those skilled in the art that the mode and detail of the present invention can be variously changed without departing from the scope and spirit of the present invention. Therefore, the present invention is not construed as being limited to the description of Embodiment Modes. It is to be noted that the portions denoted by the same reference numerals in different drawings are the same, and description of such portions on their material, shape, manufacturing method, and the like will not be repeated.

Embodiment Mode 1

In this embodiment mode, a method of manufacturing a semiconductor device of the present invention is described.

First, a bonding substrate 100 is cleaned and then an insulating film 101 is formed over the bonding substrate 100, as shown in FIG. 1A. As the bonding substrate 100, a single crystal or polycrystalline semiconductor substrate formed of silicon, germanium, or the like can be used. Alternatively, a single crystal or polycrystalline semiconductor substrate formed of a compound semiconductor such as gallium arsenide or indium phosphide can be used as the bonding substrate 100. Further alternatively, a semiconductor substrate formed of silicon having crystal lattice distortion, silicon germanium which is obtained by adding germanium to silicon, or the like may be used as the bonding substrate 100. Silicon having distortion can be formed by formation of silicon on silicon germanium or silicon nitride which has larger lattice constant than silicon.

The bonding substrate 100 may be processed into desired size and shape. The bonding substrate 100 is preferably rectangular in shape considering that, for example, the shape of a base substrate 105 to which the bonding substrate 100 is attached later is generally rectangular in shape and that a region which is exposed to light by a light-exposure apparatus such as a reduced-projection light-exposure apparatus is rectangular in shape. It is to be noted that the rectangular shape includes a square shape unless otherwise stated. For example, the bonding substrate 100 is preferably processed so that the length thereof on a longer side is n times (n is any positive integer satisfying n≧1) that on one side of a light-exposure region formed by one shot of a reduced-projection light-exposure apparatus.

The bonding substrate 100 can have a rectangular shape by cutting a circular bulk single crystal semiconductor substrate available in the market. The substrate can be cut by a cutter such as a dicer or a wire saw, a laser cutter, a plasma cutter, an electron beam cutter, or any other cutter. Alternatively, the bonding substrate 100 can have a rectangular shape in such a manner that an ingot used for manufacturing semiconductor substrates before being sliced into substrates is processed into a rectangular form so as to have a rectangular cross section and this rectangular ingot is sliced.

The insulating film 101 may be a single insulating film or a stack of plural insulating films. For example, in this embodiment mode, the insulating film 101 is formed of silicon oxide. Considering that a region which includes impurities will be removed later, it is preferable to form the insulating film 101 to a thickness of from 15 nm to 500 nm inclusive. As a film included in the insulating film 101, an insulating film including silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can be used.

In this specification, the oxynitride includes a larger amount of oxygen atoms than nitrogen atoms; whereas the nitride oxide includes a larger amount of nitrogen atoms than oxygen atoms. For example, a silicon oxynitride film includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed using Rutherford backscattering spectrometry (RBS) and hydrogen forward scattering (HFS). Further, a silicon nitride oxide film includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed using RBS and HFS. It is to be noted that percentages of nitrogen, oxygen, silicon, and hydrogen fall within the ranges given above, where the total number of atoms contained in the silicon oxynitride film or the silicon nitride oxide film is defined as 100 at. %.

If the base substrate 105 includes an impurity which decreases reliability of a semiconductor device, such as an alkali metal or an alkaline earth metal, the insulating film 101 preferably includes at least one layer which can prevent the impurity in the base substrate 105 from diffusing into a semiconductor layer of an SOI substrate. As such a film, a silicon nitride film, a silicon nitride oxide film, an aluminum nitride film, an aluminum nitride oxide film, or the like can be given. When such a film is included in the insulating film 101, the insulating film 101 can serve as a barrier film.

For example, in a case where the insulating film 101 is formed as a barrier film with a single-layer structure, the insulating film 101 can be formed using a silicon nitride film, a silicon nitride oxide film, an aluminum nitride film, or an aluminum nitride oxide film having a thickness of 15 nm to 300 nm inclusive.

In a case of forming the insulating film 101 as a barrier film with a two-layer structure, the upper layer includes an insulating film with a high barrier property. A silicon nitride film, a silicon nitride oxide film, an aluminum nitride film, or an aluminum nitride oxide film each having a thickness of 15 nm to 300 nm can be used as the upper layer of the insulating film. These films have a high blocking effect for preventing impurity diffusion, but their internal stress is also high. Therefore, as the lower layer of the insulating film which is in contact with the bonding substrate 100, a film with an effect of relieving the stress of the upper layer of the insulating film is preferable. As the insulating film with the effect of relieving the stress of the upper layer of the insulating film, a silicon oxide film, a thermally oxidized film formed by thermally oxidizing the bonding substrate 100, or the like is given. The lower layer of the insulating film can be formed to a thickness of from 5 nm to 200 nm inclusive.

In order for the insulating film 101 to function as a blocking film, the insulating film 101 is preferably formed by a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

In the case of using silicon oxide for the insulating film 101, the insulating film 101 can be formed by a vapor deposition method such as thermal CVD, plasma CVD, atmospheric pressure CVD, or bias ECRCVD with the use of a mixed gas of silane and oxygen, a mixed gas of TEOS (tetraethoxysilane) and oxygen, or the like. In this case, a surface of the insulating film 101 may be densified by oxygen plasma treatment. In the case of using silicon nitride for the insulating film 101, the insulating film 101 can be formed with the use of a mixed gas of silane and ammonia by a vapor deposition method such as plasma CVD. In the case of using silicon nitride oxide for the insulating film 101, the insulating film 101 can be formed by a vapor deposition method such as plasma CVD with the use of a mixed gas of silane and ammonia or a mixed gas of silane and nitrogen oxide.

Alternatively, the insulating film 101 may be formed of silicon oxide by a chemical vapor deposition method with the use of an organosilane gas. Examples of the organosilane gas include silicon-containing compounds such as tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

Alternatively, the insulating film 101 can be formed using an oxide film obtained by oxidizing the bonding substrate 100. Thermal oxidation treatment for forming this oxide film may be dry oxidation and the dry oxidation may be performed by adding a halogen-containing gas to an oxidative atmosphere. As the halogen-containing gas, one or plural kinds of gases selected from HCl, HF, $NF_3$, HBr, $Cl_2$, $ClF_3$, $BCl_3$, $F_2$, $Br_2$, or the like can be used.

For example, thermal treatment is performed at 700° C. or higher in an atmosphere including HCl at 0.5 to 10 volume % (preferably 3 volume %) with respect to oxygen. The thermal oxidation is preferably performed at a temperature in the range of 950° C. to 1100° C. inclusive. The process time may be in the range of 0.1 to 6 hours, preferably 0.5 to 1 hour. The thickness of the oxide film to be formed can be set in the range of 15 nm to 1100 nm (preferably 60 nm to 300 nm), for example 150 nm.

By the oxidation treatment performed within this temperature range, a gettering effect by the halogen element can be obtained. The gettering gives an effect of removing metal impurities in particular. That is, with action of chlorine, an impurity such as metal turns into a volatile chloride and is released into air, thereby being removed from the bonding substrate 100. Moreover, since the halogen element existing during the oxidation treatment terminates defects of a surface of the bonding substrate 100, the local level density of an interface between the oxide film and the bonding substrate 100 can be decreased.

By this thermal oxidation treatment performed in the halogen-containing atmosphere, the oxide film can include the halogen. When the oxide film includes the halogen element at a concentration of $1 \times 10^{17}$ atoms/cm$^3$ to $5 \times 10^{20}$ atoms/cm$^3$, the oxide film captures the impurities such as metal; therefore, the contamination of a semiconductor film to be formed later can be prevented.

Figure 1B:
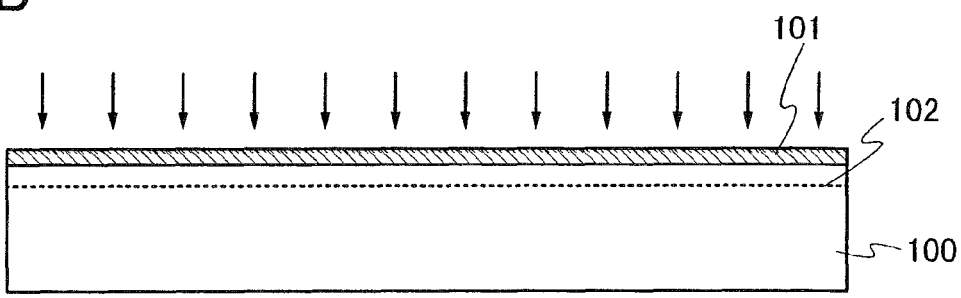

Next, as shown in FIG. 1B, an ion beam including an ion accelerated by an electric field is added as indicated by arrows to the bonding substrate 100 through the insulating film 101. Thus, a fragile layer 102 having very small voids is formed in a region at a predetermined depth from the surface of the bonding substrate 100. The depth at which the fragile layer 102 is formed can be adjusted by the acceleration energy of the ion beam and the angle at which the ion beam enters. The acceleration energy can be adjusted by acceleration voltage, dosage, or the like. The fragile layer 102 can be formed at the same depth or substantially the same depth as the average depth at which the ions have entered. The thickness of a semiconductor film 106 which will separate from the bonding substrate 100 is determined based on the depth at which the ions are added. The depth at which the fragile layer 102 is formed can be set in the range of, for example, 50 nm to 500 nm inclusive, preferably 50 nm to 200 nm inclusive, from the surface of the bonding substrate 100.

The ions are added to the bonding substrate 100 desirably by an ion doping method in which mass separation is not performed because the takt time can be shortened; however, the present invention may employ an ion implantation method in which mass separation is performed.

When hydrogen ($H_2$) is used for a source gas, $H^+$, $H_2^+$, and $H_3^+$ can be produced by exciting a hydrogen gas. Proportions of ion species produced from a source gas can be changed by controlling a plasma excitation method, the pressure of an atmosphere for producing plasma, the amount of supplied source gas, or the like. In the case where the ion irradiation is performed by an ion doping method, it is preferable that $H_3^+$ be contained at 70% or more with respect to the total amount of $H^+$, $H_2^+$, and $H_3^+$ in the ion beam, and it is more preferable that the proportion of $H_3^+$ be 80% or more. When $H_3^+$ occupies 70% or more, the proportion of $H_2^+$ ions in the ion beam gets smaller relatively, which results in lower variation in the average depth at which the hydrogen ions in the ion beam enter. Consequently, the ion implantation efficiency improves and the takt time can be shortened.

Further, $H_3^+$ has larger mass than $H^+$ and $H_2^+$. When the ion beam containing a larger proportion of $H_3^+$ is compared with the ion beam containing a larger proportion of $H^+$ and $H_2^+$, the former can add hydrogen to a shallower region of the bonding substrate 100 than the latter even though the acceleration voltage at the time of doping is the same. Moreover, the former has a steep concentration profile of hydrogen added to the bonding substrate 100 in a thickness direction, the fragile layer 102 itself can be formed to be thinner.

In the case of performing ion irradiation by an ion doping method with the use of a hydrogen gas, the acceleration voltage is set in the range of 10 kV to 200 kV inclusive and the dosage is set in the range of $1 \times 10^{16}$ ions/cm$^2$ to $6 \times 10^{16}$ ions/cm$^2$ inclusive. Under this condition, the fragile layer 102 can be formed in the bonding substrate 100 at a depth of 50 nm to 500 nm inclusive, though depending on the ion species included in the ion beam and its proportion, and the film thickness of the insulating film 101.

For example, in the case where the bonding substrate 100 is a single crystal silicon substrate and the insulating film 101 is formed using a 50-nm-thick silicon oxynitride film and a 50-nm-thick silicon nitride oxide film, a semiconductor film with a thickness of about 120 nm can be separated from the bonding substrate 100 under the condition where the source gas is hydrogen, the acceleration voltage is 40 kV, and the dosage is $2 \times 10^{16}$ ions/cm$^2$. Moreover, in the case where the insulating film 101 is formed using a 100-nm-thick silicon oxynitride film and a 50-nm-thick silicon nitride oxide film, a semiconductor film with a thickness of about 70 nm can be separated from the bonding substrate 100 under the condition where the source gas is hydrogen, the acceleration voltage is 40 kV, and the dosage is $2.2 \times 10^{16}$ ions/cm$^2$. In this manner, when the insulating film 101 is formed to be thicker, the semiconductor film 106 can be later formed to be thinner.

Helium (He) can alternatively be used as the source gas of the ion beam. Since most of the ion species produced by exciting helium are He$^+$, the bonding substrate 100 can be irradiated mainly with He$^+$ even in an ion doping method in which mass separation is not performed. Therefore, very small voids can be formed in the fragile layer 102 efficiently by an ion doping method. In the case of performing the ion irradiation by an ion doping method using helium, the acceleration voltage can be set in the range of 10 kV to 200 kV inclusive and the dosage can be set in the range of $1 \times 10^{16}$ ions/cm$^2$ to $6 \times 10^{16}$ ions/cm$^2$ inclusive.

A halogen gas such as a chlorine gas ($Cl_2$ gas) or a fluorine gas ($F_2$ gas) can be used for the source gas.

In the case of irradiating the bonding substrate 100 with ions by an ion doping method, impurities existing in an ion doping apparatus are added together with the ions to a processing object; therefore, there is possibility that the impurities exist on and near the surface of the insulating film 101. Moreover, an ion doping method easily causes particles, and moreover easily causes defects in attaching the bonding substrate 100 and the base substrate to each other because of the particles.

A sample was formed by adding hydrogen ions to a silicon wafer by an ion doping method under the condition where the flow rate of hydrogen is 50 sccm, the acceleration voltage is 20 kV, and the dosage is $1.5 \times 10^{16}$ ions/cm$^2$, and this sample was subjected to TXRF (total reflection X-ray fluorescence analysis). As a result of this experiment, it was found out that elements such as P, S, Cl, Ca, Mn, Fe, and Mo existed on the surface of the silicon wafer.

Therefore, in this embodiment mode, removal of a region on and near the surface of the insulating film 101, where the amount of the impurities and particles is the largest, is performed. Specifically, the region of the insulating film 101 may be removed by 0.5 nm to 50 nm, desirably 1 nm to 5 nm, from the surface thereof or may be removed by about 0.5% to 50%, desirably about 1% to 5% of the film thickness of the insulating film 101. The removal of the region on and near the surface of the insulating film 101 may be performed by etching such as dry etching or wet etching, polishing, or the like.

The dry etching may employ, for example, an RIE (reactive ion etching) method, an ICP (inductively coupled plasma) etching method, an ECR (electron cyclotron resonance) etching method, a parallel plate (capacitive coupled plasma) etching method, a magnetron plasma etching method, a dual-frequency plasma etching method, a helicon wave plasma etching method, or the like. For example, in the case of removing a region on and near a surface of a silicon nitride oxide film by an ICP etching method, the region can be removed to a depth of about 50 nm from the surface under the condition where the flow rate of CHF$_3$ as an etching gas is 7.5 sccm, the flow rate of He is 100 sccm, the reaction pressure is 5.5 Pa, the temperature of a lower electrode is 70° C., the RF (13.56 MHz) electric power applied to a coil-shaped electrode is 475 W, the electric power applied to the lower electrode (on bias side) is 300 W, and the etching time is about 10 seconds.

Instead of CHF$_3$, which is a fluorine-based gas, a chlorine-based gas such as Cl$_2$, BCl$_3$, SiCl$_4$, or CCl$_4$; another fluorine-based gas such as $CF_4$, $SF_6$, or $NF_3$; or $O_2$ can be used as appropriate for the etching gas. Moreover, an inert gas other than He may be added to the etching gas. For example, one or plural elements selected from Ne, Ar, Kr, or Xe can be used as the inert element which is added to the etching gas.

In the case of removing a region on and near a surface of a silicon nitride oxide film or a silicon oxide film by wet etching, a fluorinated acid based solution including ammonium hydrogen fluoride, ammonium fluoride, or the like may be used as an etchant. Alternatively, dilute fluorinated acid may be used. Further alternatively, dilute fluorinated acid and water including ozone may be discharged alternately. After the wet etching, rinse may be performed using pure water or functional water such as water including hydrogen or water including carbonic acid.

The polishing can be performed by CMP (chemical mechanical polishing), liquid jet polishing, or the like.

Figure 1C:
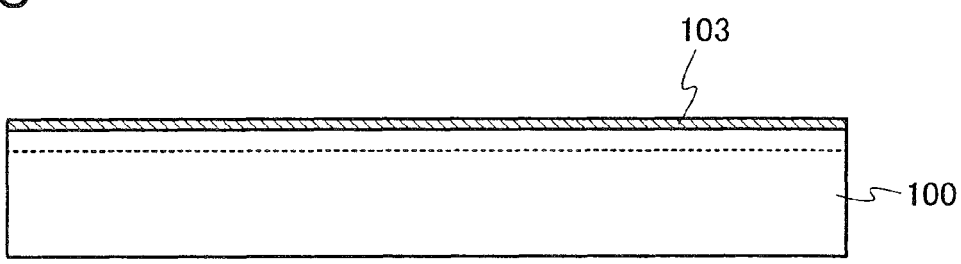

By the removal of the region on and near the surface of the insulating film 101, an insulating film 103 which is thinner than the insulating film 101 is formed as shown in FIG. 1C.

Although this embodiment mode describes the example of removing the region on and near the surface of the insulating film 101, the insulating film 101 may entirely be removed and another insulating film may newly be formed.

Figure 1D:
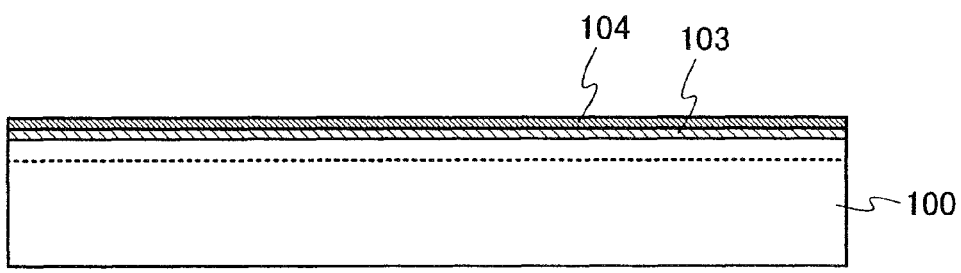

Next, an insulating film 104 is formed over the insulating film 103 as shown in FIG. 1D. The insulating film 104 is formed in such a manner that the temperature at which the element or molecule added to the fragile layer 102 does not separate out, in other words, the temperature at which the fragile layer 102 does not release gas is applied to the bonding substrate 100. Specifically, the temperature is preferably about 350° C. or lower.

The insulating film 104 forms a bonding plane which is flat and hydrophilic over the surface of the bonding substrate 100. Therefore, the average roughness Ra of the insulating film 104 is preferably 0.7 nm or less, more preferably 0.4 nm or less, and much more preferably 0.2 nm or less. The thickness of the insulating film 104 is preferably in the range of 5 nm to 500 nm inclusive and more preferably in the range of 10 nm to 200 nm inclusive.

The insulating film 104 is preferably an insulating film formed by a chemical vapor reaction, and a silicon oxide film is preferred. In the case of forming a silicon oxide film as the insulating film 104 by a plasma excitation CVD method, an organosilane gas and an oxygen ($O_2$) gas are preferably used for a source gas. By the use of an organosilane gas for the source gas, a silicon oxide film with a flat surface can be formed at a process temperature of 350° C. or lower. Alternatively, an LTO (low temperature oxide) can be formed by a thermal CVD method at a heat temperature of 200° C. to 500° C. inclusive. The LTO can be formed using monosilane ($SiH_4$), disilane ($Si_2H_6$), or the like for a silicon source gas and using dinitrogen monoxide ($N_2O$) or the like for an oxygen source gas.

For example, in the case of using TEOS and $O_2$ for the source gas to form the silicon oxide film as the insulating film 104, the condition may be set as follows: the flow rate of TEOS is 15 sccm, the flow rate of $O_2$ is 750 sccm, the film forming pressure is 100 Pa, the film forming temperature is 300° C., the RF output is 300 W, and the power source frequency is 13.56 MHz.

It is to be noted that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the bonding layer at a low temperature. A siloxane bond, which is a covalent bond, is formed finally between the base substrate and the insulating film. The insulating film such as the aforementioned silicon oxide film formed using organosilane or the LTO formed at a relatively low temperature is suitable for bonding at a low temperature, as compared with a thermally oxidized film having no OH bonds or having very few OH bonds which is used in Smart Cut (registered trademark) or the like.

Next, the bonding substrate 100 over which the insulating film 103 and the insulating film 104 are formed is cleaned. This cleaning step can be performed by ultrasonic cleaning with the use of pure water or by two-fluid jet cleaning with the use of pure water and nitrogen. The ultrasonic cleaning is preferably megahertz ultrasonic cleaning (megasonic cleaning). After the ultrasonic cleaning or the two-fluid jet cleaning, the bonding substrate 100 may be cleaned with ozone water. By the cleaning with ozone water, removal of organic substances and surface activation for improving the hydrophilic property of a surface of the insulating film 104 can be performed.

The surface activation on the insulating film 104 can be performed by irradiation with an atomic beam or an ion beam, plasma treatment, or radical treatment instead of by the cleaning with ozone water. In the case of utilizing the atomic beam or the ion beam, an inert gas neutral atom beam or inert gas ion beam of argon or the like can be used.

Although the insulating film 104 is formed after the formation of the fragile layer 102 in this embodiment mode, the insulating film 104 is not necessarily formed. However, since the insulating film 104 is formed after the formation of the fragile layer 102, the insulating film 104 has a flatter surface than the insulating film 101 formed before the formation of the fragile layer 102. Therefore, the formation of the insulating film 104 can increase the strength of bonding performed later.

Figure 2A:
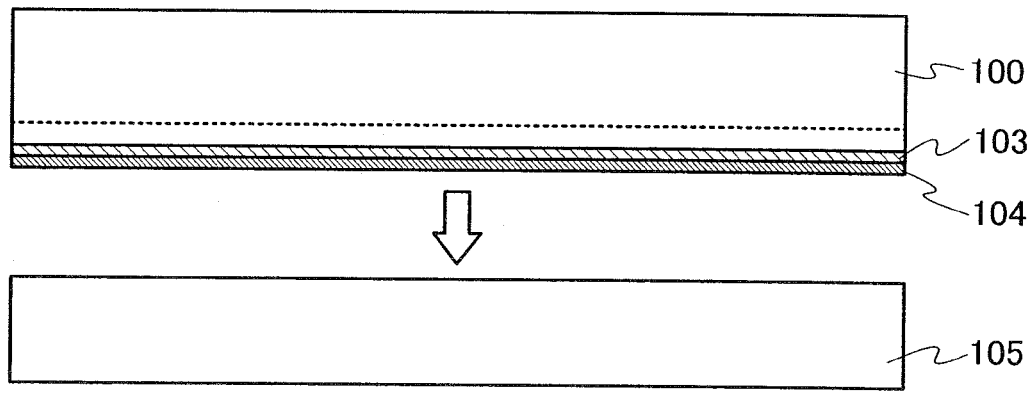
FIGS. 2A to 2C show a method of manufacturing a semiconductor device of the present invention.

Next, the bonding substrate 100 and the base substrate 105 are attached to each other in such a manner that the insulating film 104 faces the base substrate 105, as shown in FIG. 2A. A surface of the base substrate 105 is cleaned before the attachment. The surface of the base substrate 105 can be cleaned with chlorine acid and hydrogen peroxide water or by megahertz ultrasonic cleaning, two-fluid jet cleaning, or cleaning with ozone water.

The attachment can be performed by adding pressure of about 5 kPa to 5 MPa to one portion at an end of the base substrate 105. The insulating film 104 and the base substrate 105 begin to bond to each other from the portion of the base substrate 105 at which the pressure is applied; thus, one base substrate 105 and the bonding substrate 100 are attached to each other.

The bonding is performed by Van der Waals force, so that the bonding is firm even at room temperature. By applying pressure to the bonding substrate 100 and the base substrate 105, hydrogen bond can form firm bonding. Since the aforementioned bonding can be performed at low temperature, a variety of substrates can be used as the base substrate 105. For example, a variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 105. As the base substrate 105, alternatively, a semiconductor substrate formed of silicon, gallium arsenide, indium phosphide, or the like can be used. Further alternatively, a metal substrate including a stainless steel substrate may be used as the base substrate 105. Substrates with coefficients of thermal expansion ranging from $25\times10^{-7}/°$ C. to $50\times10^{-7}/°$ C. (preferably $30\times10^{-7}/°$ C. to $40\times10^{-7}/°$ C.) inclusive and strain points ranging from 580° C. to 680° C. (preferably 600° C. to 680° C.) inclusive are preferably used as the glass substrate which serves as the base substrate 105. When the glass substrate is an alkali-free glass substrate, impurity contamination of semiconductor devices can be suppressed.

As the glass substrate, a mother glass substrate developed for liquid crystal panel production is preferably used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. By the use of a large-sized mother glass substrate as the base substrate 105 to manufacture an SOI substrate, the SOI substrate can have a larger area. When the SOI substrate can have a larger area, a large number of chips such as ICs or LSIs can be manufactured at one time and the number of chips manufactured from one substrate increases. As a result, the productivity can be improved drastically.

If the base substrate 105 is a glass substrate that largely shrinks when heat treatment is performed thereon, such as EAGLE 200 (manufactured by Corning Incorporated), a defect may be observed in attachment after the bonding step. Therefore, in order to avoid the defect in attachment that is caused by the shrink, the base substrate 105 may be subjected to heat treatment in advance before the bonding step shown below.

Moreover, an insulating film may be formed in advance over the base substrate 105. The base substrate 105 is not necessarily provided with an insulating film on its surface. However, the formation of the insulating film on the surface of the base substrate 105 can prevent impurities of the base substrate 105, such as an alkali metal and an alkaline earth metal, from entering the bonding substrate 100. Moreover, in the case of forming the insulating film on the surface of the base substrate 105, the insulating film over the base substrate 105 is bonded to the insulating film 104; therefore, a wider variety of substrates can be used as the base substrate 105. In general, the upper temperature limits of substrates formed of flexible synthetic resins such as plastics tend to be low. However, as long as the substrates can resist process temperatures in manufacturing steps, the substrates formed of such resins can be used as the base substrate 105 in the case of forming the insulating film over the base substrate 105. In addition, polyester typified by polyethylene terephthalate (PET); polyether sulfone (PES); polyethylene naphthalate (PEN); polycarbonate (PC); polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin; and the like can be given. In the case of forming the insulating film over the base substrate 105, the attachment is preferably performed after activating the surface of this insulating film in a manner similar to the insulating film 104.

If a plurality of bonding substrates 100 is attached to the base substrate 105, there are some cases in which the base substrate 105 is not in contact with surfaces of the insulating films 104 of the bonding substrates 100 because of the difference in thickness of the bonding substrates 100. Therefore, the pressure is preferably applied to not just one point but each bonding substrate 100. Although the surfaces of the insulating films 104 are a little different in height, the bonding can be performed on the entire surface of the insulating films 104 as long as a part of the insulating film 104 is in close contact with the base substrate 105 by bending of the base substrate 105.

After the bonding substrate 100 is attached to the base substrate 105, heat treatment is preferably performed in order to increase the bonding force at the bonding interface between the base substrate 105 and the insulating film 104. This heat treatment is performed at a temperature at which the fragile layer 102 does not crack; specifically, the temperature is in the range of 200° C. to 450° C. inclusive. By attaching the bonding substrate 100 to the base substrate 105 within this temperature range, the bonding force between the base substrate 105 and the insulating film 104 can be made firm.

If the bonding plane is contaminated by dust or the like at the time of attaching the bonding substrate 100 and the base substrate 105, the contaminated portion is not bonded. In order to avoid the contamination of the bonding plane, the attachment of the bonding substrate 100 and the base substrate 105 is preferably performed in an airtight chamber. At the time of attaching the bonding substrate 100 and the base substrate 105, the process chamber may have pressure reduced to about $5.0\times10^{-3}$ Pa and the atmosphere of the bonding process may be cleaned.

Figure 2B:
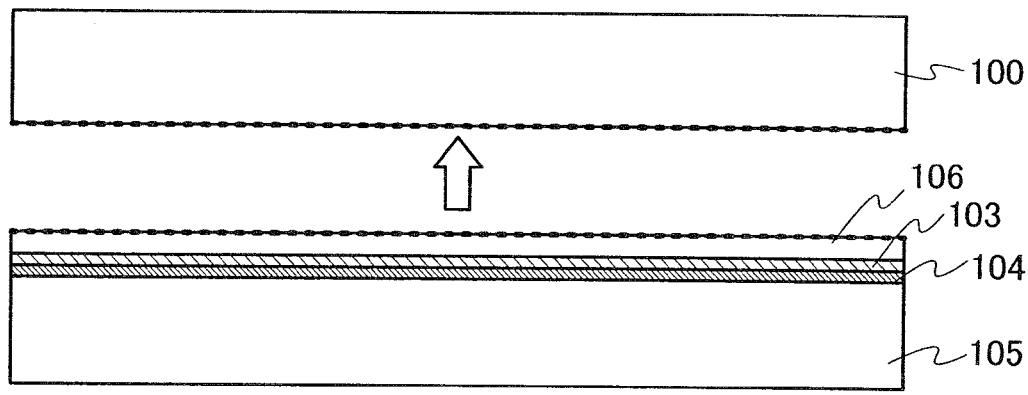

Subsequently, heat treatment is performed as shown in FIG. 2B whereby very small voids adjacent to each other in the fragile layer 102 are combined, so that the very small voids increase in volume. As a result, the bonding substrate 100 is separated at the fragile layer 102 through an explosive reaction; thus, the semiconductor film 106 is separated from the bonding substrate 100. Since the insulating film 104 is bonded to the base substrate 105, the semiconductor film 106 separated from the bonding substrate 100 is fixed to the base substrate 105. The heat treatment for separating the semiconductor film 106 from the bonding substrate 100 is performed at a temperature below the strain point of the base substrate 105.

This heat treatment can be performed with an RTA (rapid thermal anneal) apparatus, a resistance heating furnace, or a microwave heating apparatus. As the RTA apparatus, a GRTA (gas rapid thermal anneal) apparatus or an LRTA (lamp rapid thermal anneal) apparatus can be used.

In the case of using a GRTA apparatus, the heat temperature can be set in the range of 550° C. to 650° C. inclusive and the process time can be set in the range of 0.5 to 60 minutes inclusive. In the case of using a resistance heating apparatus, the heat temperature can be set in the range of 200° C. to 650° C. inclusive and the process time can be set in the range of 2 to 4 hours inclusive.

The heat treatment may be performed by dielectric heating with a high-frequency wave such as a microwave. The heat treatment by dielectric heating can be performed by irradiating the bonding substrate 100 with a high-frequency wave with a frequency of 300 MHz to 3 THz generated by a high-frequency wave generating apparatus. In specific, for example, irradiation with a microwave with a frequency of 2.45 GHz at 900 W is performed for 14 minutes to combine very small voids adjacent to each other in the fragile layer, whereby the bonding substrate 100 can be separated finally.

A specific process method of heat treatment which uses a vertical furnace utilizing resistance heating is described. The base substrate 105 to which the bonding substrate 100 is attached is disposed on a boat of the vertical furnace and this boat is delivered in a chamber of the vertical furnace. In order to suppress oxidation of the bonding substrate 100, first, the chamber is evacuated to vacuum so that the chamber has a vacuum degree of about $5\times10^{-3}$ Pa. After making the chamber vacuum, nitrogen is supplied to the chamber so that the chamber has a nitrogen atmosphere of atmospheric pressure. In this period, the heat temperature is increased to 200° C.

After the chamber has a nitrogen atmosphere of atmospheric pressure, heat treatment is performed at 200° C. for two hours. Then, the temperature is increased to 400° C. in an hour. After the state of 400° C. gets stable, the temperature is increased to 600° C. in an hour. After the state of 600° C. gets stable, heat treatment is performed at 600° C. for two hours. Subsequently, the heat temperature is decreased to 400° C. in an hour. After 10 to 30 minutes, the boat is removed from the chamber. The base substrate 105 to which the bonding substrate 100 and the semiconductor film 106 are attached and which is disposed on the boat is cooled under the atmosphere.

The heat treatment using the above resistance heating furnace is performed by successively performing heat treatment for strengthening the bonding force between the insulating film 104 and the base substrate 105 and heat treatment for splitting the fragile layer 102. In the case of performing the two heat treatments in different apparatuses, for example, heat treatment is performed at 200° C. for two hours in a resistance heating furnace and then the base substrate 105 and the bonding substrate 100 which are attached to each other are removed from the furnace. Next, heat treatment is performed by an RTA apparatus at a process temperature ranging from 600° C. to 700° C. inclusive for 1 to 30 minutes inclusive, so that the bonding substrate 100 is separated at the fragile layer 102.

It is to be noted that, in some cases, a periphery of the bonding substrate 100 is not bonded to the base substrate 105. This is because the periphery of the bonding substrate 100 is chamfered or has a curvature, so that the base substrate 105 is not in close contact with the insulating film 104 or the fragile layer 102 is difficult to split at the periphery of the bonding substrate 100. Another reason is that polishing such as CMP performed in manufacturing the bonding substrate 100 is not enough at the periphery of the bonding substrate 100, so that a surface thereof is rougher at the periphery than at a center. Still another reason is that, in the case where a carrier or the like damages the periphery of the bonding substrate 100 at the time of delivery of the bonding substrate 100, the damage makes it difficult to bond the periphery to the base substrate 105. For these reasons, the semiconductor film 106 which is smaller than the bonding substrate 100 is attached to the base substrate 105.

It is to be noted that the bonding substrate 100 may be subjected to hydrogenation treatment before the bonding substrate 100 is separated. The hydrogenation treatment is performed, for example, at 350° C. for about two hours in a hydrogen atmosphere.

If a plurality of bonding substrates 100 is attached to the base substrate 105, the plural bonding substrates 100 may have different crystal plane orientation. The mobility of majority carriers in a semiconductor depends on crystal plane orientation. Therefore, the semiconductor film 106 may be formed by selecting as appropriate the bonding substrate 100 which has crystal plane orientation suitable for a semiconductor element to be formed. For example, in the case of forming an n-type semiconductor element with the use of the semiconductor film 106, the formation of the semiconductor film 106 with a {100} plane can increase the mobility of majority carriers in the semiconductor element. On the other hand, for example, in the case of forming a p-type semiconductor element with the use of the semiconductor film 106, the formation of the semiconductor film 106 with a {110} plane can increase the mobility of majority carriers in the semiconductor element. Then, in the case of forming a transistor as a semiconductor element, a direction of attaching the semiconductor film 106 is determined in consideration of a channel direction and crystal plane orientation.

Figure 2C:
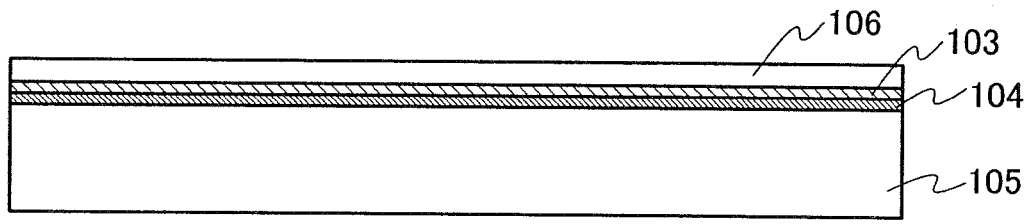

Next, as shown in FIG. 2C, a surface of the semiconductor film 106 may be flattened by polishing. The flattening is not always necessary; however, the flattening makes it possible to improve the characteristics of an interface between semiconductor films 107 and 108 and a gate insulating film which are formed later. In specific, the polishing may be chemical mechanical polishing (CMP), liquid jet polishing, or the like. The semiconductor film 106 is thinned by the flattening. The flattening may be performed on the semiconductor film 106 before being etched; alternatively, the flattening may be performed on the semiconductor films 107 and 108 formed by etching.

Not the polishing but etching may be performed on the surface of the semiconductor film 106 in order to flatten the surface of the semiconductor film 106. The etching may be performed by a dry etching method, for example, an RIE (reactive ion etching) method, an ICP (inductively coupled plasma) etching method, an ECR (electron cyclotron resonance) etching method, a parallel plate (capacitive coupled) etching method, a magnetron plasma etching method, a dual-frequency plasma etching method, a helicon wave plasma etching method, or the like.

For example, when an ICP etching method is employed, etching may be performed under the following condition: the flow rate of chlorine, which is an etching gas, is 40 sccm to 100 sccm; the electric power applied to a coil-shaped electrode is 100 W to 200 W; the electric power applied to a lower electrode (on the bias side) is 40 W to 100 W; and the reaction pressure is 0.5 Pa to 1.0 Pa. In this embodiment mode, the semiconductor film 106 is thinned to have a thickness of about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 to 27 seconds. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen is used as appropriate.

The etching can not only thin the semiconductor film 106 to the film thickness optimum for a semiconductor element to be formed later but also flatten the surface of the semiconductor film 106.

The semiconductor film 106 disposed in close contact with the base substrate 105 includes crystal defects due to the formation and split of the fragile layer 102. Moreover, the surface of the semiconductor film 106 is not flat. In order to decrease the crystal defects and improve the flatness, the semiconductor film 106 may be irradiated with a laser beam.

In the case where the surface of the semiconductor film 106 is flattened by dry etching before the laser irradiation, damages such as crystal defects might occur on and near the surface of the semiconductor film 106 due to the dry etching. However, the aforementioned laser irradiation can recover even the damages caused by the dry etching.

Since the increase in temperature of the base substrate 105 can be suppressed in this laser irradiation step, a substrate having low heat resistance such as a glass substrate can be used as the base substrate 105. It is preferable that the semiconductor film 106 be partly melted by the laser irradiation. This is because if the semiconductor film 106 is completely melted, the recrystallization of the semiconductor film 106 is accompanied with disordered nucleation of the semiconductor film 106 in a liquid phase and crystallinity of the semiconductor film 106 is lowered. By partial melting, so-called longitudinal growth in which crystal growth proceeds from an unmelted solid portion occurs in the semiconductor film 106. Due to the recrystallization by the longitudinal growth, crystal defects of the semiconductor film 106 are decreased and crystallinity thereof is recovered. The state in which the semiconductor film 106 is completely melted indicates the state in which the semiconductor film 106 is melted to be in a liquid state to the interface with the insulating film 104. On the other hand, the state where the semiconductor layer 106 is partly melted indicates that an upper part thereof is melted and is in a liquid phase and a lower part thereof is in a solid phase.

As a laser generating the laser beam, a laser which has an oscillation wavelength is in the range of ultraviolet light to visible light regions is selected. The laser beam has a wavelength that is absorbed in the semiconductor film 106. The wavelength can be determined in consideration of skin depth of the laser beam or the like. For example, the wavelength can be set in the range of 250 nm to 700 nm inclusive.

As this laser, a continuous wave (CW) laser, a quasi-CW laser, or a pulsed laser can be used. A pulsed laser is preferable for partial melting. For example, a pulsed laser which has a repetition rate of 1 MHz or less and a pulse width of 10 ns to 500 ns inclusive is given. For example, a XeCl excimer laser which has a repetition rate of 10 Hz to 300 Hz, a pulse width of 25 ns, and a wavelength of 308 nm can be used.

The energy of the laser beam can be determined in consideration of the wavelength of the laser beam, the skin depth of the laser beam, the thickness of the semiconductor film 106, or the like. The energy of the laser beam can be set in the range of 300 mJ/cm$^2$ to 800 mJ/cm$^2$ inclusive. For example, in the case of using a pulsed laser with a wavelength of a laser beam of about 308 nm to irradiate the semiconductor film 106 with a thickness of about 120 nm, the energy density of the laser beam can be set in the range of 600 mJ/cm$^2$ to 700 mJ/cm$^2$.

The laser irradiation is preferably performed in an inert atmosphere such as a rare gas atmosphere or a nitrogen atmosphere, or in a vacuum state. In the case of an inert atmosphere, the laser irradiation may be performed in an airtight chamber whose atmosphere is controlled. If the chamber is not used, the laser irradiation in an inert atmosphere can be achieved by spraying an inert gas such as a nitrogen gas to the surface to be irradiated with the laser beam.

The inert atmosphere such as nitrogen or the vacuum state makes the available laser energy range wider as compared with the air atmosphere because the inert atmosphere and the vacuum state have a higher effect of improving the flatness of the semiconductor film 106 and a higher effect of suppressing cracks and ridges than the air atmosphere.

The laser beam preferably has its cross section shaped into a linear form with homogenous energy distribution through an optical system. Accordingly, the laser irradiation can be performed homogenously at high throughput. With the beam length of the laser beam longer than one side of the base substrate 105, the entire semiconductor film 106 attached to the base substrate 105 can be irradiated with the laser beam by scanning the laser beam once. When the beam length of the laser beam is shorter than one side of the base substrate 105, the beam length may be set so that the entire semiconductor film 106 attached to the base substrate 105 can be irradiated with the laser beam by scanning the laser beam a plurality of times.

Before irradiating the semiconductor film 106 with the laser beam, an oxide film such as a natural oxide film formed on the surface of the semiconductor film 106 is removed. The oxide film is removed because the surface of the semiconductor film 106 is not flattened sufficiently if the laser irradiation is performed on the semiconductor film 106 with the oxide film remaining on the surface. The oxide film can be removed by performing treatment on the semiconductor film 106 with fluorinated acid. The treatment with fluorinated acid is desirably performed until the surface of the semiconductor film 106 has a water-repellent property. Having a water-repellent property indicates the removal of the oxide film from the semiconductor film 106.

For example, the laser irradiation step can be performed as follows. First, the oxide film on the surface of the semiconductor film 106 is removed by processing the semiconductor film 106 for 110 seconds with fluorinated acid diluted by 1/100. As a laser generating the laser beam, a XeCl excimer laser (wavelength: 308 nm, pulse width: 25 ns, and repetition rate: 60 Hz) is used. The cross section of the laser beam is shaped into a linear form with a size of 300 mm×0.34 mm through an optical system. The laser scanning speed is 2.0 mm/s and the scanning pitch is 33 μm, and the beam shot number is about 10; in this manner, the semiconductor film 106 is irradiated with the laser beam. The laser beam is scanned with an irradiation surface sprayed with a nitrogen gas. In the case of the base substrate 105 with a size of 730 mm×920 mm, the beam length of the laser beam is 300 mm; therefore, a region to be irradiated with the laser beam is divided into three parts so that the entire semiconductor film 106 attached to the base substrate 105 can be irradiated with the laser beam.

After the laser irradiation, the surface of the semiconductor film 106 may be etched. If the surface of the semiconductor film 106 is etched after the laser irradiation, the surface of the semiconductor film 106 is not necessarily etched before the laser irradiation. Moreover, if the surface of the semiconductor film 106 is etched before the laser irradiation, the surface of the semiconductor film 106 is not necessarily etched after the laser irradiation. In the present invention, alternatively, the etching may be performed both before and after the laser irradiation.

The etching can not only thin the semiconductor film 106 to the film thickness optimum for a semiconductor element to be formed later but also flatten the surface of the semiconductor film 106.

After the laser irradiation, the semiconductor film 106 is preferably subjected to heat treatment at 500° C. to 650° C. inclusive. This heat treatment can recover the defects of the semiconductor film 106 and relieve the distortion of the semiconductor film 106, both of which the laser irradiation was not able to achieve. This heat treatment can employ an RTA (rapid thermal anneal) apparatus, a resistance heating furnace, or a microwave heating apparatus. As the RTA apparatus, a GRTA (gas rapid thermal anneal) apparatus or an LRTA (lamp rapid thermal anneal) can be used. For example, in the case of using a resistance heating furnace, heat treatment is performed at 500° C. for an hour and then another heat treatment is performed at 550° C. for four hours.

Figure 3A:
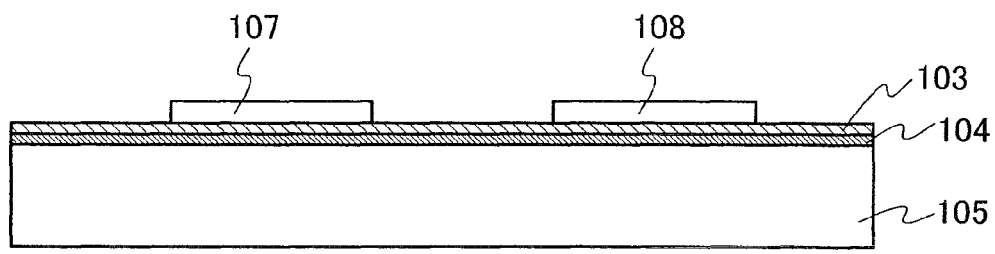
FIGS. 3A and 3B show a method of manufacturing a semiconductor device of the present invention.

Next, as shown in FIG. 3A, the semiconductor film 106 is partly etched into the semiconductor film 107 and the semiconductor film 108. By further etching the semiconductor film 106, a region of the semiconductor film 106 at the end thereof where the bonding strength is not enough can be removed.

Although the semiconductor films 107 and 108 are formed by etching one semiconductor film 106 in this embodiment mode, the number of semiconductor films which are formed is not limited to two.

Figure 3B:
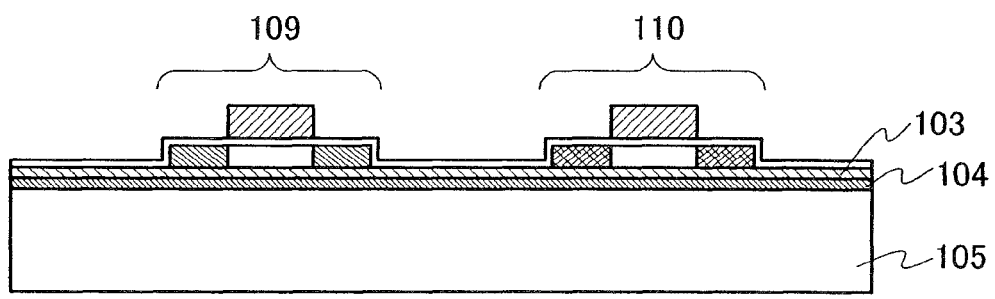

With the use of the semiconductor films 107 and 108 formed through the above steps, for example, a variety of semiconductor elements such as a transistor 109 and a transistor 110 shown in FIG. 3B can be formed.

In the present invention, after formation of the fragile layer 102, the region on and near the surface of the insulating film 101 where the contamination is remarkable is removed by etching, polishing, or the like. Therefore, the amount of impurities mixing into the semiconductor film 106 over the base substrate 105 can be suppressed. Moreover, in a semiconductor device which is completed finally, it is possible to prevent the impurities from causing decrease in reliability and decrease in electrical characteristics of transistors, such as variation in threshold voltage or increase in leakage current.

The present invention can be applied in manufacturing any kind of semiconductor devices including microprocessors, integrated circuits such as image processing circuits, RF tags for transmitting and receiving data with an interrogator without contact, semiconductor display devices, and the like. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

Embodiment Mode 2

Unlike Embodiment Mode 1, this embodiment mode describes a method of manufacturing a semiconductor device of the present invention, in which the fragile layer 102 is formed before the formation of the insulating film 103.

Figure 4A:
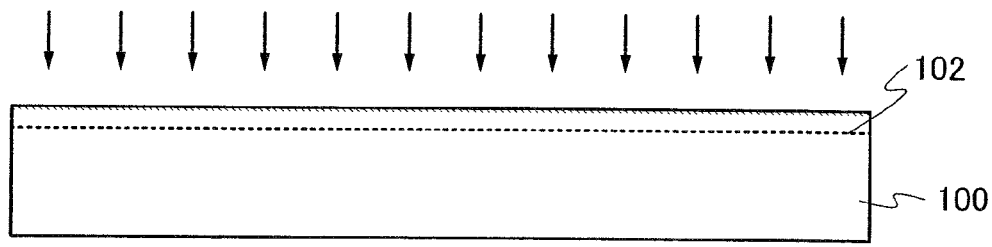
FIGS. 4A to 4D show a method of manufacturing a semiconductor device of the present invention.

First, after cleaning the bonding substrate 100, an ion beam including ions accelerated by an electric field is delivered to the bonding substrate 100 as indicated by arrows, whereby the fragile layer 102 having very small voids is formed in a region at a predetermined depth from a surface of the bonding substrate 100, as shown in FIG. 4A. The depth at which the fragile layer 102 is formed can be adjusted by the acceleration energy of the ion beam and the angle at which the ion beam enters. The acceleration energy can be adjusted by acceleration voltage, dosage, or the like. The fragile layer 102 can be formed at the same depth or substantially the same depth as the average depth at which the ions have entered. The thickness of the semiconductor film 106 which will separate from the bonding substrate 100 is determined based on the depth at which the ions are added. The depth at which the fragile layer 102 is formed can be set in the range of, for example, 50 nm to 600 nm inclusive, preferably 50 nm to 300 nm inclusive.

The ions are added to the bonding substrate 100 desirably by an ion doping method in which mass separation is not performed, because the takt time is short; however, the present invention may employ an ion implantation method in which mass separation is performed.

When hydrogen ($H_2$) is used for a source gas, $H^+$, $H_2^+$, and $H_3^+$ can be produced by exciting a hydrogen gas. Proportions of ion species produced from a source gas can be changed by controlling a plasma excitation method, the pressure of an atmosphere for producing plasma, the amount of supplied source gas, or the like. In the case where the ion irradiation is performed by an ion doping method, it is preferable that $H_3^+$ be contained at 70% or more with respect to the total amount of $H^+$, $H_2^+$, and $H_3^+$ in the ion beam, and it is more preferable that the proportion of $H_3^+$ be 80% or more. When $H_3^+$ occupies 70% or more, the proportion of $H_2^+$ ions in the ion beam 121 gets smaller relatively, which results in lower variation in the average depth at which the hydrogen ions in the ion beam 121 enter. Consequently, the ion addition efficiency improves and the takt time can be shortened.

Further, $H_3^+$ has larger mass than $H^+$ and $H_2^+$. When the ion beam containing a higher proportion of $H_3^+$ is compared with the ion beam containing a higher proportion of $H^+$ and $H_2^+$, the former can add hydrogen to a shallower region of the bonding substrate 100 than the latter even though the acceleration voltage at the time of doping is the same. Moreover, the former has a steep concentration profile of hydrogen added to the bonding substrate 100 in a thickness direction, the fragile layer 102 itself can be formed to be thinner.

In the case of performing ion irradiation by an ion doping method with use of a hydrogen gas, the acceleration voltage is set in the range of 5 kV to 200 kV inclusive and the dosage is set in the range of $1\times10^{16}$ ions/cm$^2$ to $6\times10^{16}$ ions/cm$^2$ inclusive. Under this condition, the fragile layer 102 can be formed in the bonding substrate 100 at a depth of 50 nm to 600 nm inclusive, though depending on the ion species included in the ion beam and its proportion, and the film thickness of the insulating film 101.

For example, in the case where the bonding substrate 100 is a single crystal silicon substrate, a semiconductor film with a thickness of about 220 nm can be separated from the bonding substrate 100 under the condition where the source gas is hydrogen, the acceleration voltage is 40 kV, and the dosage is $2.2\times10^{16}$ ions/cm$^2$. Moreover, a semiconductor film with a thickness of about 120 nm can be separated from the bonding substrate 100 under the condition where the source gas is hydrogen, the acceleration voltage is 40 kV, and the dosage is $2.2\times10^{16}$ ions/cm$^2$.

Helium (He) can alternatively be used as the source gas of the ion beam. Since most of the ion species produced by exciting helium are He$^+$, the bonding substrate 100 can be irradiated mainly with He$^+$ even in an ion doping method in which mass separation is not performed. Therefore, very small voids can be formed in the fragile layer 102 efficiently by an ion doping method. In the case where the ion irradiation is performed by an ion doping method using helium, the acceleration voltage can be set in the range of 5 kV to 200 kV inclusive and the dosage can be set in the range of $1\times10^{16}$ ions/cm$^2$ to $6\times10^{16}$ ions/cm$^2$ inclusive.

A halogen gas such as a chlorine gas ($Cl_2$ gas) or a fluorine gas ($F_2$) can be used for the source gas.

In the case of irradiating the bonding substrate 100 with the ions by an ion doping method, impurities existing in an ion doping apparatus are added together with the ions to a processing object; therefore, there is possibility that the impurities exist on and near the surface of the bonding substrate 100. Moreover, an ion doping method easily causes particles, and moreover easily causes defects in attaching the bonding substrate 100 and the base substrate to each other because of the particles.

Therefore, in this embodiment mode, a region that is on and near the surface of the bonding substrate 100 where the amount of the impurities and particles is the largest and that is shallower than the fragile layer 102 is partly removed. Specifically, a region may be removed to a depth of about 0.5 nm to 50 nm, desirably about 1 nm to 5 nm, from the surface of the bonding substrate 100, though depending on the depth at which the fragile layer 102 is formed. However, the region of the bonding substrate which is removed should not be deeper than the fragile layer 102. The removal of the region that is on and near the surface of the bonding substrate 100 may be performed by etching such as dry etching or wet etching, polishing, or the like.

The dry etching may be performed by a dry etching method, for example, an RIE (reactive ion etching) method, an ICP (inductively coupled plasma) etching method, an ECR (electron cyclotron resonance) etching method, a parallel plate (capacitive coupled plasma) etching method, a magnetron plasma etching method, a dual-frequency plasma etching method, a helicon wave plasma etching method, or the like. For example, in the case of removing the region on and near the surface of the bonding substrate 100, which is a single crystal semiconductor substrate, by an ICP etching method, the region can be removed to a depth of about 40 nm from the surface under the condition where the flow rate of $Cl_2$ as an etching gas is 100 sccm, the reaction pressure is 1.0 Pa, the temperature of a lower electrode is 70° C., the RF (13.56 MHz) power applied to a coil-shaped electrode is 150 W, the electric power applied to the lower electrode (on a bias side) is 40 W, and the etching time is about 30 seconds.

As the etching gas, a chlorine-based gas typified by $BCl_3$, $SiCl_4$, $CCl_4$, or the like; a fluorine-based gas typified by $CF_4$, $CHF_3$, $SF_6$, $NF_3$, or the like; or $O_2$ can be appropriately used instead of $Cl_2$. Moreover, an inert gas other than He may be added to the etching gas. For example, one or plural elements selected from Ne, Ar, Kr, or Xe can be used as the inert element.

When the region on and near the surface of the bonding substrate 100, which is a single crystal semiconductor substrate, is removed by wet etching, an organic alkali-based water solution typified by TMAH (tetramethylammonium hydroxide) or the like can be used as an etchant. In the case of removing the region on and near the surface of the bonding substrate 100 by wet etching with the use of a TMAH solution, the TMAH solution is adjusted so that TMAH is contained in the solution at a concentration of 2.38% and the etching is performed at 50° C. for about 30 seconds; thus, the region can be removed to a depth of about 50 nm from the surface.

The polishing can be performed by CMP (chemical mechanical polishing), liquid jet polishing, or the like.

Figure 4B:
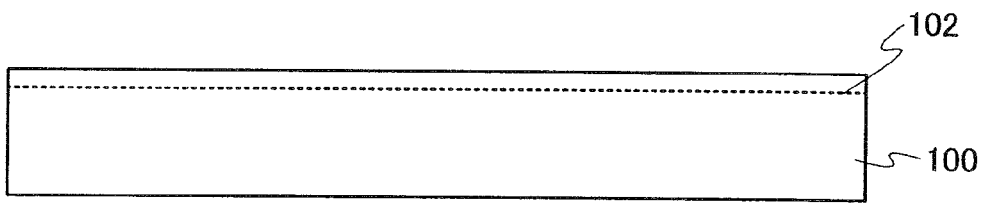

By the removal of the region on and near the surface of the bonding substrate 100, the depth at which the fragile layer 102 is formed in the bonding substrate 100 decreases as shown in FIG. 4B.

Figure 4C:
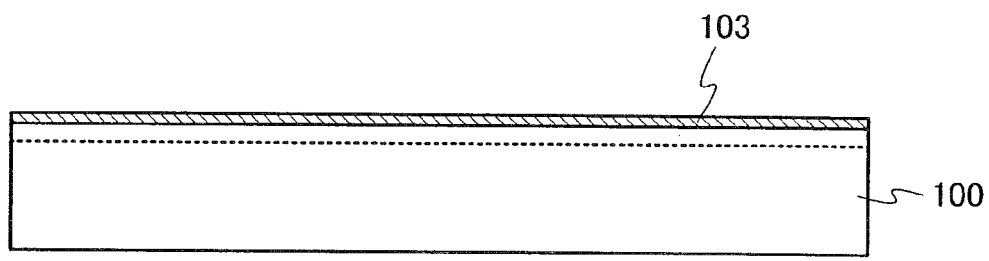

Next, as shown in FIG. 4C, the insulating film 103 is formed on a surface of the bonding substrate 100 that is exposed by the above etching. The insulating film 103 may be a single insulating film or a stack of plural insulating films. For example, in this embodiment mode, the insulating film 103 is silicon oxide. The thickness of the insulating film 103 is preferably in the range of 5 nm to 400 nm inclusive. As a film included in the insulating film 103, an insulating film containing silicon or germanium as its composition such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can also be used.

If the base substrate 105 includes an impurity which decreases the reliability of a semiconductor device, such as an alkali metal or an alkaline earth metal, the insulating film 103 preferably includes at least one layer which can prevent such an impurity from diffusing from the base substrate 105 into a semiconductor layer of an SOI substrate. As such a film, a silicon nitride film, a silicon nitride oxide film, an aluminum nitride film, an aluminum nitride oxide film, or the like can be given. With such a film included in the insulating film 103, the insulating film 103 can function as a barrier film.

For example, in the case where the insulating film 103 is formed as a barrier film with a single-layer structure, the insulating film 103 can be formed using a silicon nitride film, a silicon nitride oxide film, an aluminum nitride film, or an aluminum nitride oxide film to a thickness of from 5 nm to 200 nm inclusive.

In the case where the insulating film 103 is formed as a barrier film with a two-layer structure, the upper layer of the insulating film is formed to have a high barrier property. For example, a silicon nitride film, a silicon nitride oxide film, an aluminum nitride film, or an aluminum nitride oxide film each having a thickness of 5 nm to 200 nm inclusive can be used as the upper layer. These films have a high blocking effect for preventing impurity diffusion, but their internal stress is also high. Therefore, as the lower layer of the insulating film which is in contact with the bonding substrate 100, a film with an effect of relieving the stress of the upper layer of the insulating film is preferable. As the insulating film with the effect of relieving the stress of the upper layer of the insulating film, a silicon oxide film, a thermally oxidized film formed by thermally oxidizing the bonding substrate 100, or the like is given. The lower layer of the insulating film can be formed to a thickness of from 5 nm to 200 nm inclusive.

For example, in order for the insulating film 103 to function as a blocking film, the insulating film 103 is preferably formed by a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

For example, in the case of using silicon oxide for the insulating film 103, the insulating film 103 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. In this case, a surface of the insulating film 103 may be densified by oxygen plasma treatment. In the case of using silicon nitride for the insulating film 103, the insulating film 103 can be formed using a mixed gas of silane and ammonia by a vapor deposition method such as plasma CVD. In addition, in the case of using silicon nitride oxide for the insulating film 103, the insulating film 103 can be formed using a mixed gas of silane and ammonia or a mixed gas of silane and nitrogen oxide by a vapor deposition method such as plasma CVD.

Alternatively, the insulating film 103 may be formed of silicon oxide by a chemical vapor deposition method with use of an organosilane gas. Examples of the organosilane gas include silicon-containing compounds such as tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

Alternatively, the insulating film 103 can be formed using a thermally oxidized film obtained by thermally oxidizing the bonding substrate 100. Thermal oxidation treatment for forming the above thermally oxidized film may be dry oxidation, and the dry oxidation may be performed by adding a halogen-containing gas to an oxidative atmosphere. As the halogen-containing gas, one ore more kinds of gases selected from HCl, HF, $NF_3$, HBr, $Cl_2$, $ClF_3$, $BCl_3$, $F_2$, $Br_2$, or the like can be applied.

For example, thermal treatment is performed at 700° C. or higher in an atmosphere containing HCl at 0.5 to 10 volume % (preferably 3 volume %) with respect to oxygen. The thermal oxidation may be performed at a temperature in the range of 950° C. to 1100° C. inclusive. The treatment time may be 0.1 to 6 hours, preferably 0.5 to 1 hour. The thickness of the oxide film to be formed can be set in the range of 10 nm to 1000 nm (preferably, 50 nm to 200 nm), and for example, the thickness is 100 nm.

By the oxidation treatment performed within this temperature range, a gettering effect by the halogen element can be obtained. Gettering particularly gives an effect of removing a metal impurity. That is, with action of chlorine, an impurity such as metal turns into a volatile chloride and is released into air, thereby being removed from the bonding substrate 100. Moreover, the halogen element included in the oxidation treatment terminates defects on the surface of the bonding substrate 100; therefore, the interface state density of an interface between the oxide film and the bonding substrate 100 can be decreased.

By thermal oxidation treatment performed in the atmosphere including halogen, the oxide film can include halogen. When the oxide film includes a halogen element at a concentration of $1 \times 10^{17}$ atoms/cm$^3$ to $5 \times 10^{20}$ atoms/cm$^3$, the oxide film captures impurities such as metal; therefore, the contamination of the semiconductor film to be formed later can be prevented.

Figure 4D:
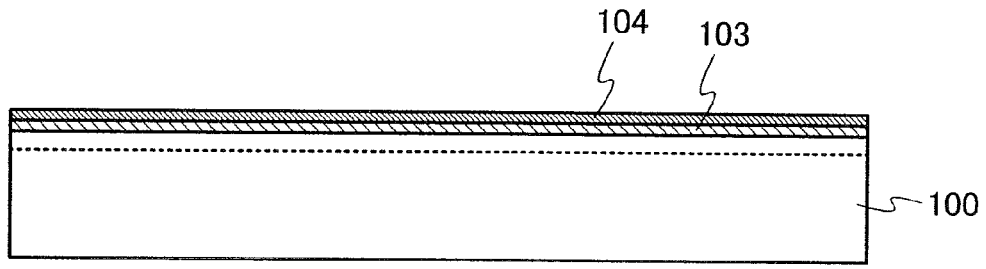

Next, an insulating film 104 is formed over the insulating film 103, as shown in FIG. 4D. Steps following the step of forming the insulating film 104 are performed with reference to Embodiment Mode 1; thus, a semiconductor device can be manufactured.

In the present invention, after the formation of the fragile layer 102, the region on and near the surface of the bonding substrate 100 where the contamination is remarkable is removed by etching, polishing, or the like. Therefore, the amount of impurities mixing in the semiconductor film to be formed later over the base substrate can be suppressed. Moreover, in the semiconductor device which is completed finally, it is possible to prevent the impurities from causing decrease in reliability and electrical characteristics of transistors, such as variation in threshold voltage and increase in leakage current.

Embodiment Mode 3

This embodiment mode describes a method of manufacturing a thin film transistor, one of semiconductor elements, as an example of a method of manufacturing a semiconductor device with use of a base substrate with a semiconductor film attached, a so-called SOI substrate. A variety of semiconductor devices can be formed by combination of a plurality of thin film transistors.

Figure 5A:
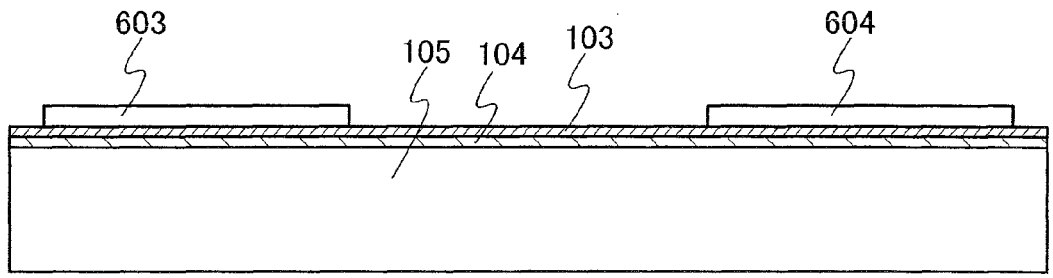
FIGS. 5A to 5D show a method of manufacturing a semiconductor device of the present invention.

First, the semiconductor film 106 over the base substrate 105 is processed (patterned) into a desired shape by etching, thereby forming semiconductor films 603 and 604 as shown in FIG. 5A.

In order to control threshold voltage, a p-type impurity such as boron, aluminum, or gallium or an n-type impurity such as phosphorus or arsenic may be added to the semiconductor films 603 and 604. For example, in the case of adding boron as the p-type impurity, boron may be added at a concentration in the range of $5 \times 10^{16}$ atoms/cm$^3$ to $1 \times 10^{17}$ atoms/cm$^3$. The impurity for controlling the threshold voltage may be added to the semiconductor film 106 or to the semiconductor films 603 and 604. Alternatively, the impurity for controlling the threshold voltage may be added to the bonding substrate 100. Further alternatively, the impurity may be added first to the bonding substrate 100 in order to roughly control the threshold voltage and then to the semiconductor film 106 or to the semiconductor films 603 and 604 in order to fine control the threshold voltage.

Further, hydrogenation treatment may be performed after the formation of the semiconductor films 603 and 604 and before the formation of a gate insulating film 606. The hydrogenation treatment is performed, for example, at 350° C. for about two hours in a hydrogen atmosphere.

Figure 5B:
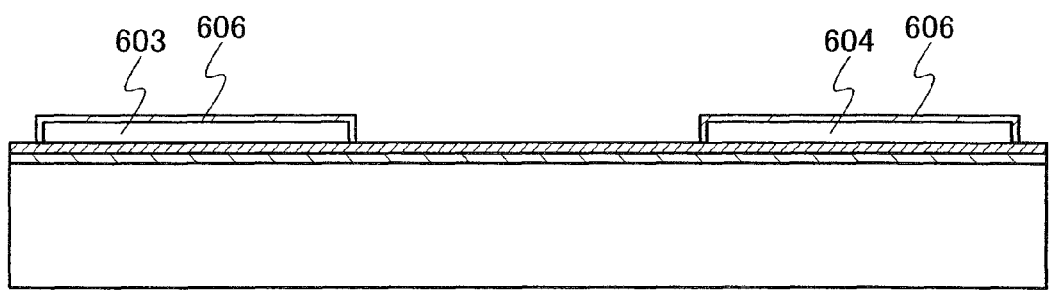

Next, as shown in FIG. 5B, the gate insulating film 606 is formed so as to cover the semiconductor films 603 and 604. Surfaces of the semiconductor films 603 and 604 may be oxidized or nitrided by high-density plasma treatment, so that the gate insulating film 606 can be formed. The high-density plasma treatment is performed using a mixed gas of a rare gas such as He, Ar, Kr, or Xe and any of oxygen, nitrogen oxide, ammonia, nitrogen, hydrogen, or the like. When plasma excitation is performed by introduction of microwaves, plasma with a low electron temperature and high density can be generated. The surfaces of the semiconductor films are oxidized or nitrided by oxygen radicals (which include OH radicals in some cases) or nitrogen radicals (which include NH radical in some cases) produced by such high-density plasma, whereby an insulating film of 1 nm to 20 nm thick, desirably 5 nm to 10 nm thick, is formed in contact with the semiconductor films. The insulating film with a thickness of 5 nm to 10 nm is used as the gate insulating film 606. For example, dinitrogen monoxide ($N_2O$) is diluted with Ar by 1 to 3 times (flow rate) and a microwave (2.45 GHz) electric power of 3 kW to 5 kW is applied with a pressure of 10 Pa to 30 Pa to oxidize or nitride the surfaces of the semiconductor films 603 and 604. By this process, an insulating film of 1 nm to 10 nm (preferably 2 nm to 6 nm) thick is formed. Moreover, dinitrogen monoxide ($N_2O$) and silane ($SiH_4$) are introduced and a microwave (2.45 GHz) electric power of 3 kW to 5 kW is applied with a pressure of 10 Pa to 30 Pa to form a silicon oxynitride film by a vapor deposition method, thereby forming a gate insulating film. With a combination of a solid-phase reaction and a reaction by a vapor deposition method, the gate insulating film with low interface state density and excellent withstand voltage can be formed.

Since the oxidation or nitridation of the semiconductor films by the high-density plasma treatment is a solid-phase reaction, the interface state density between the gate insulating film 606 and each of the semiconductor films 603 and 604 can be drastically decreased. Further, since the semiconductor films 603 and 604 are directly oxidized or nitrided by the high-density plasma treatment, variation in thickness of the insulating film to be formed can be suppressed. Moreover, in the case where the semiconductor films have crystallinity, the surfaces of the semiconductor films are oxidized by the solid state reaction through the high-density plasma treatment, whereby rapid oxidation only at crystal grain boundaries can be suppressed and the gate insulating film with favorable uniformity and low interface state density can be formed. A transistor in which the insulating film formed by the high-density plasma treatment is used as part of the gate insulating film or as the whole gate insulating film can have less variation in characteristics.

Alternatively, the gate insulating film 606 may be formed by thermally oxidizing the semiconductor films 603 and 604. The gate insulating film 606 may be formed of a single layer or stacked layers of a film including silicon oxide, silicon nitride oxide, silicon nitride, hafnium oxide, aluminum oxide, or tantalum oxide, by a plasma CVD method, a sputtering method, or the like.

Alternatively, heat treatment may be performed at a temperature in the range of 350° C. to 450° C. inclusive after the formation of the gate insulating film 606 including hydrogen, whereby hydrogen in the gate insulating film 606 diffuses to the semiconductor films 603 and 604. In this case, the gate insulating film 606 may be formed by depositing silicon nitride or silicon nitride oxide by a plasma CVD method at a process temperature of 350° C. or lower. By supplying hydrogen to the semiconductor films 603 and 604, defects which serve as trapping centers in the semiconductor films 603 and 604 and at an interface between the gate insulating film 606 and each of the semiconductor films 603 and 604 can be decreased.

Figure 5C:
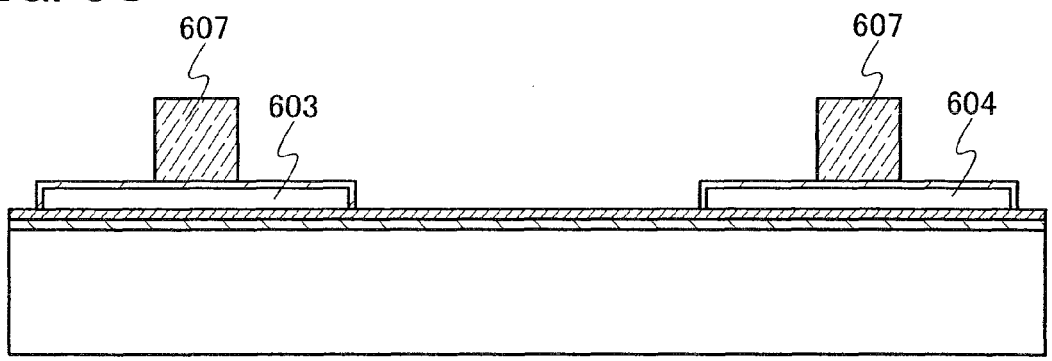

Next, a conductive film is formed over the gate insulating films 606, and then the conductive film is processed (patterned) into predetermined shapes, whereby electrodes 607 are formed over the semiconductor films 603 and 604 as illustrated in FIG. 5C. A CVD method, a sputtering method, or the like can be used for forming the conductive film. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing the above-described metal as a main component or a compound containing the above-described metal can also be used. Alternatively, the conductive film may be formed of a semiconductor such as polycrystalline silicon obtained by doping a semiconductor film with an impurity element such as phosphorus which imparts conductivity.

In a case of employing a two-layer structure, tantalum nitride or tantalum (Ta) can be used for a first layer and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two layers of the conductive film are formed. In addition, as a combination of the two layers of the conductive film, for example, nickel silicide and silicon doped with an impurity which imparts n-type conductivity, WSix and silicon doped with an impurity which imparts n-type conductivity, or the like may be used.

Although the electrode 607 is formed by a single-layer conductive film in this embodiment mode, this embodiment mode is not limited to this structure. The electrode 607 may be formed by stacking plural conductive films. In the case of a three-layer structure in which three conductive films are stacked, a stacked-layer structure of a molybdenum film, an aluminum film, and a molybdenum film is preferably employed.

As a mask used for forming the electrodes 607, silicon oxide, silicon nitride oxide, or the like may be used instead of resist. Although, in this case, a step of forming the mask made of silicon oxide, silicon nitride oxide, or the like by patterning is added, the decrease in film thickness and width of the mask at the time of etching is less than that in the case of using a resist mask; accordingly, the electrodes 607 each having a desired width can be formed. Alternatively, the electrodes 607 may be formed selectively by a droplet discharge method without using the mask.

Note that a droplet discharging method means a method in which droplets containing a predetermined composition are discharged or ejected from fine pores to form a predetermined pattern, and includes an inkjet method and the like.

The electrodes 607 can be formed in such a manner that the conductive film is etched into desired tapered shapes by an ICP (inductively coupled plasma) etching method in which the etching condition (e.g., the amount of electric power applied to a coil-shaped electrode layer, the amount of electric power applied to an electrode layer on the substrate side, and the electrode temperature on the substrate side) is controlled as appropriate. Further, angles and the like of the tapered shapes can also be controlled by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 5D:
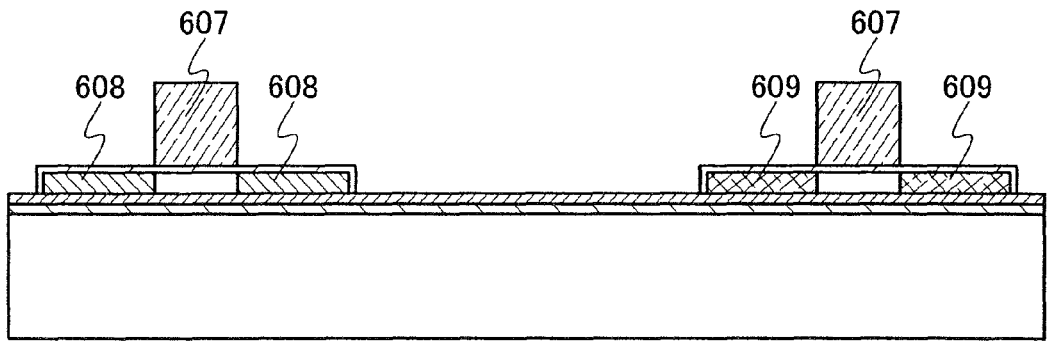

Subsequently, as shown in FIG. 5D, impurity elements imparting one conductivity type are added to the semiconductor films 603 and 604 by using the electrodes 607 as masks. In this embodiment mode, an impurity element imparting p-type conductivity (e.g., boron) is added to the semiconductor film 604, and an impurity element imparting n-type conductivity (e.g., phosphorus or arsenic) is added to the semiconductor film 603. It is to be noted that when the p-type impurity element is added to the semiconductor film 604, the semiconductor film 603 to which the n-type impurity element is added is covered with a mask or the like so that the p-type impurity element is added selectively. On the other hand, when the n-type impurity element is added to the semiconductor film 603, the semiconductor film 604 to which the p-type impurity element is added is covered with a mask or the like so that the n-type impurity element is added selectively. Alternatively, after adding an impurity element imparting one of p-type and n-type conductivity to the semiconductor films 603 and 604, an impurity element imparting the other conductivity may be added to only one of the semiconductor films 603 and 604 selectively at higher concentration than the previously added impurity. By the impurity addition, impurity regions 608 are formed in the semiconductor film 603 and impurity regions 609 are formed in the semiconductor film 604.

Figure 6A:
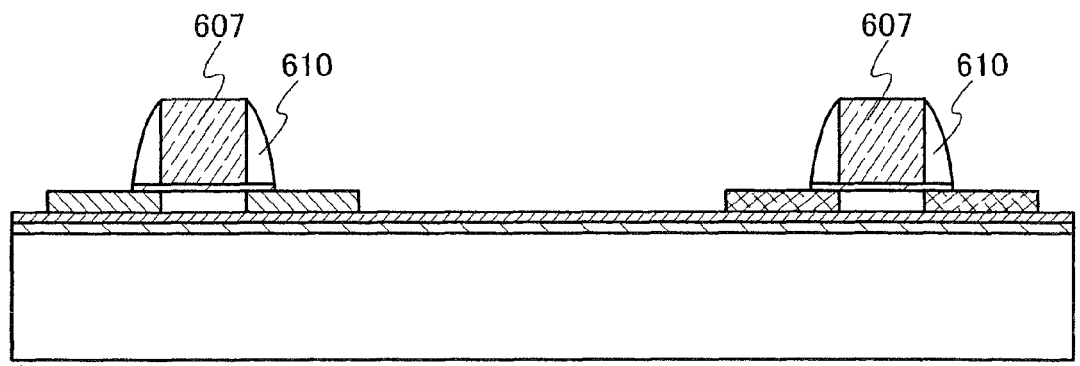
FIGS. 6A to 6C show a method of manufacturing a semiconductor device of the present invention.

Subsequently, as shown in FIG. 6A, sidewalls 610 are formed at side surfaces of the electrodes 607. For example, the sidewalls 610 can be formed in such a manner that an insulating film is newly formed so as to cover the gate insulating film 606 and the electrodes 607, and the newly formed insulating film is partly etched by anisotropic etching by which etching is performed mainly in a perpendicular direction. By the anisotropic etching, the newly formed insulating film is partly etched to form the sidewalls 610 at the side surfaces of the electrodes 607. It is to be noted that the gate insulating film 606 may also be etched partly by the anisotropic etching. The insulating film for forming the sidewalls 610 may be a single layer or a stack of layers of a silicon film, a silicon oxide film, a silicon nitride oxide film, or a film containing an organic material such as an organic resin formed by a plasma CVD method, a sputtering method, or the like. In this embodiment mode, a 100-nm-thick silicon oxide film is formed by a plasma CVD method. In addition, as an etching gas, a mixed gas of $CHF_3$ and helium can be used. Note that the steps of forming the sidewalls 610 are not limited to these.

Figure 6B:
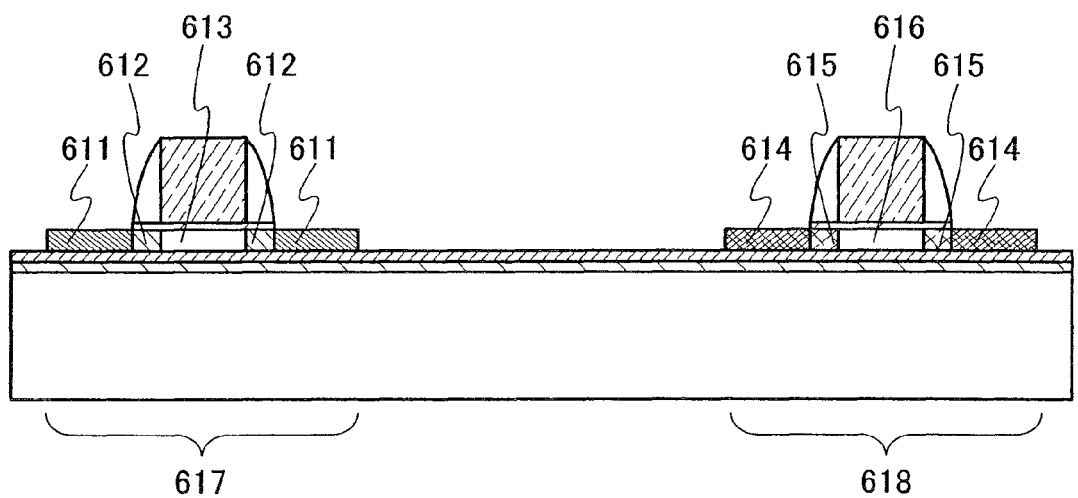

Next, as illustrated in FIG. 6B, an impurity element imparting one conductivity type is added to the semiconductor films 603 and 604 with the use of the electrodes 607 and the sidewalls 610 as masks. Note that the impurity element imparting the same conductivity type as the impurity element which has been added to the semiconductor films 603 and 604 in the previous step is added to the semiconductor films 603 and 604 at higher concentrations than that in the previous step. It is to be noted that when the p-type impurity element is added to the semiconductor film 604, the semiconductor film 603 to which the n-type impurity element is added is covered with a mask or the like so that the p-type impurity element is added selectively. On the other hand, when the n-type impurity element is added to the semiconductor film 603, the semiconductor film 604 to which the p-type impurity element is added is covered with a mask or the like so that the n-type impurity element is added selectively.

By the above-described addition of the impurity element, a pair of high-concentration impurity regions 611, a pair of low-concentration impurity regions 612, and a channel formation region 613 are formed in the semiconductor film 603. In addition, by the above-described addition of the impurity element, a pair of high-concentration impurity regions 614, a pair of low-concentration impurity regions 615, and a channel formation region 616 are formed in the semiconductor film 604. The high-concentration impurity regions 611 and 614 function as sources and drains, and the low-concentration impurity regions 612 and 615 function as LDD (lightly doped drain) regions.

It is to be noted that the sidewalls 610 formed over the semiconductor film 604 and the sidewalls 610 formed over the semiconductor film 603 may have either the same or different width in a direction where carriers move. The width of each sidewall 610 over the semiconductor film 604 which forms a p-type transistor is preferably larger than that over the semiconductor film 603 which forms an n-type transistor. This is because boron which is added for forming the source and the drain of the p-channel transistor easily diffuses so that a short channel effect is easily induced. When the width of the sidewall 610 of the p-channel transistor is made larger, boron can be added to the source and the drain at high concentration, and thus the resistance of the source and the drain can be decreased.

Next, a silicide layer may be formed by siliciding the semiconductor films 603 and 604 in order to further decrease the resistance of the sources and the drains. The siliciding is performed in such a manner that a metal is brought into contact with the semiconductor films, and silicon in the semiconductor films is made to react with the metal by heat treatment such as a GRTA method or an LRTA method. Cobalt silicide or nickel silicide may be used as the silicide. In a case where the semiconductor films 603 and 604 are thin, the siliciding may be continued to the bottom of the semiconductor films 603 and 604 in this region. As a metal material used for the siliciding, the following can be used: titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), or the like. Alternatively, the silicide may be formed by laser irradiation or light irradiation using a lamp or the like.

Through the above-described series of steps, an n-channel transistor 617 and a p-channel transistor 618 are manufactured.

Figure 6C:
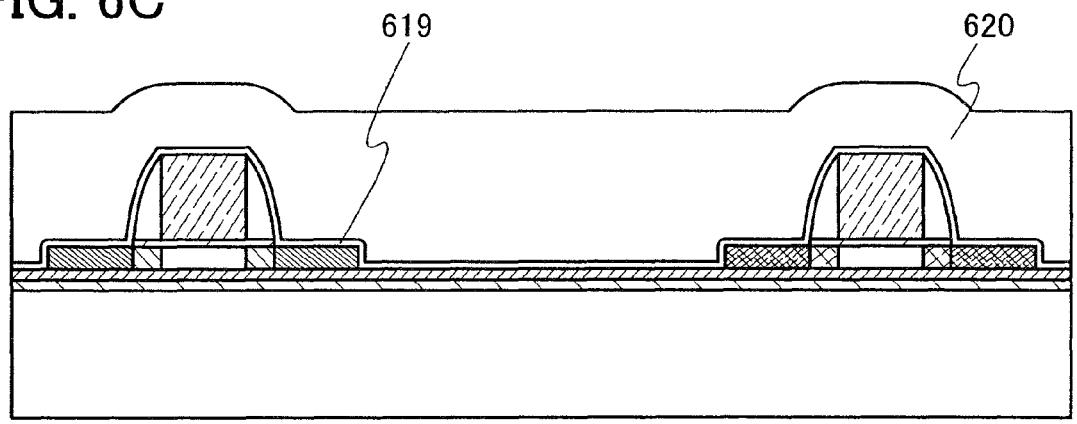

Next, an insulating film 619 is formed so as to cover the transistors 617 and 618, as shown in FIG. 6C. The insulating film 619 is not always necessary; however, the formation of the insulating film 619 can prevent impurities such as an alkali metal and an alkaline earth metal from entering the transistors 617 and 618. Specifically, it is desirable to use silicon nitride, silicon nitride oxide, aluminum nitride, aluminum oxide, silicon oxide, or the like for the insulating film 619. In this embodiment mode, the insulating film 619 is formed using a silicon nitride oxide film with a thickness of about 600 nm. In this case, the hydrogenation treatment described above may be performed after formation of the silicon nitride oxide film.

Next, an insulating film 620 is formed over the insulating film 619 so as to cover the transistors 617 and 618. An organic material having heat resistance, such as polyimide, acrylic, benzocyclobutene, polyamide, or epoxy can be used for the insulating film 620. Other than such organic materials, it is also possible to use a low-dielectric constant material (a low-k material), a siloxane-based resin, silicon oxide, silicon nitride, silicon nitride oxide, PSG (phosphosilicate glass), BPSG (borophosphosilicate glass), alumina, or the like. A siloxane-based resin may contain at least one of fluorine, an alkyl group, and aromatic hydrocarbon besides hydrogen as a substituent. Alternatively, the insulating film 620 may be formed by stacking plural insulating films formed of these materials. The insulating film 620 may have its surface flattened by a CMP method or the like.

Note that the siloxane-based resin corresponds to a resin including a Si—O—Si bond formed using a siloxane-based material as a starting material. The siloxane-based resin may have at least one of fluorine, an alkyl group, and an aromatic hydrocarbon besides hydrogen as a substituent.

For the formation of the insulating film 620, the following method can be used depending on the material of the insulating film 620: a CVD method, a sputtering method, an SOG method, spin coating, dipping, spray coating, a droplet discharge method (e.g., an inkjet method, screen printing, or offset printing), a doctor knife, a roll coater, a curtain coater, a knife coater, or the like.

Figure 7:
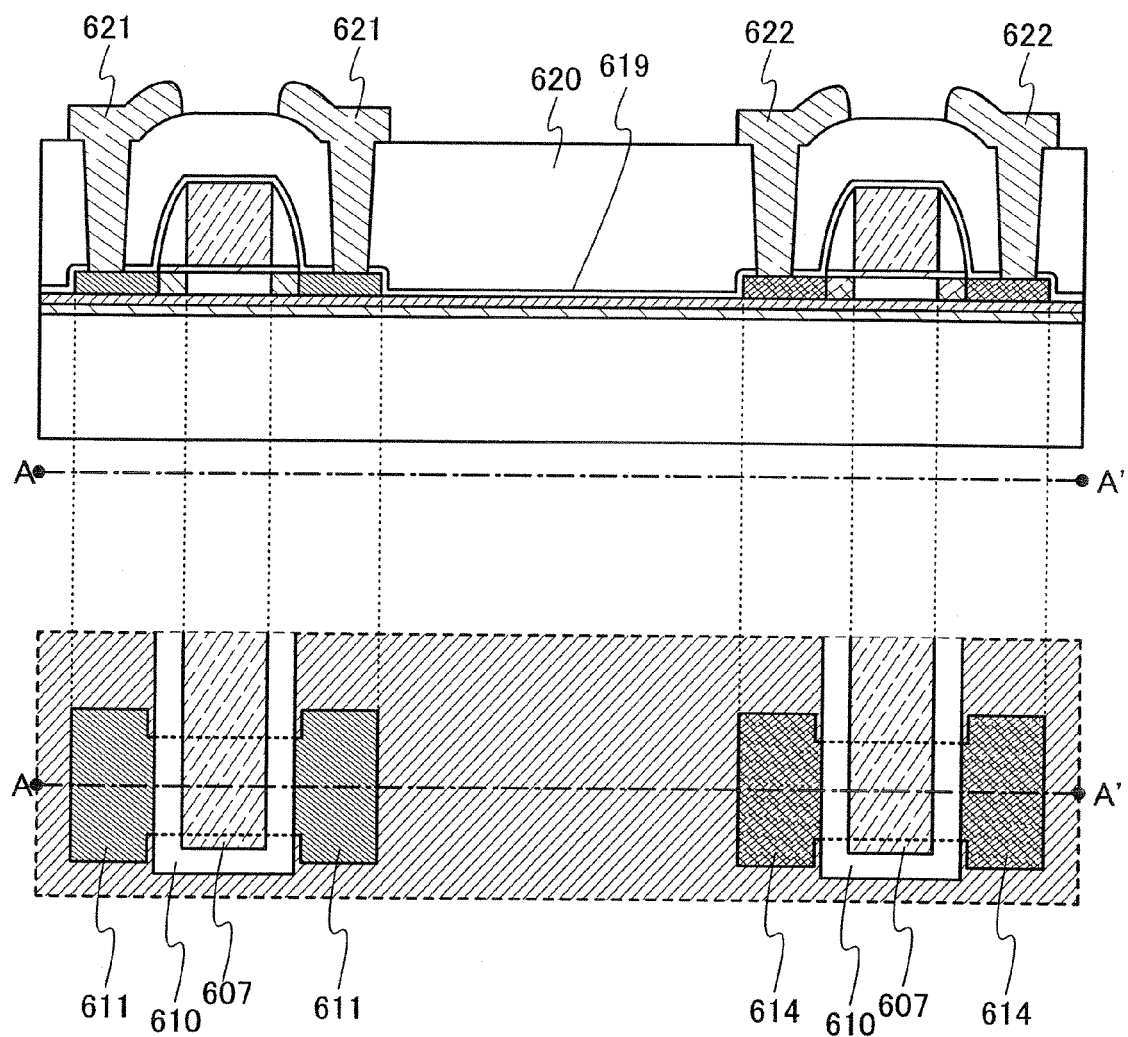
FIG. 7 shows a method of manufacturing a semiconductor device of the present invention.

Next, as illustrated in FIG. 7, contact holes are formed in the insulating film 619 and the insulating film 620 so that the semiconductor films 603 and 604 are partly exposed. Then, conductive films 621 and 622 are formed in contact with the semiconductor films 603 and 604, respectively through the contact holes. As an etching gas for forming the contact holes, a mixed gas of $CHF_3$ and He is employed, though the present invention is not limited to this.

The conductive films 621 and 622 can be formed by a CVD method, a sputtering method, or the like. In specific, the conductive films 621 and 622 can be formed of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 621 and 622 can be formed as a single layer or a stack of plural layers by using a film formed of any of the aforementioned metals.

Examples of an alloy containing aluminum as its main component include an alloy containing aluminum as its main component and also containing nickel. In addition, an alloy containing aluminum as its main component and also containing nickel and one of or both carbon and silicon can also be given as the example thereof. Since aluminum and aluminum silicon have low resistance values and are inexpensive, aluminum and aluminum silicon are suitable as a material for forming the conductive films 621 and 622. In comparison to an aluminum film, an aluminum silicon (Al—Si) film can particularly prevent the generation of hillock during resist baking at the time of patterning the conductive films 621 and 622. Cu may be mixed by approximately 0.5% into an aluminum film instead of silicon (Si).

Each of the conductive films 621 and 622 preferably employs, for example, a stacked layer structure of a barrier film, an aluminum silicon (Al—Si) film, and a barrier film, or a stacked layer structure of a barrier film, an aluminum silicon (Al—Si) film, a titanium nitride film, and a barrier film. Note that the barrier film refers to a film formed using titanium, a nitride of titanium, molybdenum, or a nitride of molybdenum. When barrier films are formed with an aluminum silicon film interposed therebetween, generation of a hillock of aluminum or aluminum silicon can be further prevented. Moreover, when the barrier film is formed of titanium which is a highly-reducible element, even if a thin oxide film is formed over the semiconductor films 603 and 604, the oxide film is reduced by the titanium contained in the barrier film, whereby preferable contact between the conductive films 621 and 622 and the semiconductor films 603 and 604 can be obtained. Further, it is also possible to stack a plurality of barrier films. In that case, for example, a five-layer structure in which titanium, titanium nitride, aluminum silicon, titanium, and titanium nitride are stacked from the bottom can be used for the conductive films 621 and 622.

The conductive films 621 and 622 may be formed of tungsten silicide with use of a $WF_6$ gas and a $SiH_4$ gas by a chemical vapor deposition method. Alternatively, the conductive films 621 and 622 may be formed of tungsten obtained by hydrogen reduction of $WF_6$.

Note that the conductive film 621 is connected to the high-concentration impurity region 611 of the n-channel transistor 617. The conductive film 622 is connected to the high-concentration impurity region 614 of the p-channel transistor 618.

FIG. 7 also illustrates a top view of the n-channel transistor 617 and the p-channel transistor 618. Note that the conductive films 621 and 622, the insulating film 619, and the insulating film 620 are omitted in FIG. 7.

In addition, although the case where each of the n-channel transistor 617 and the p-channel transistor 618 includes one electrode 607 functioning as the gate is shown as an example in this embodiment mode, the present invention is not limited to this structure. The transistor included in the semiconductor device formed by the manufacturing method of the present invention may have a multigate structure in which a plurality of electrodes functioning as gates is electrically connected to one another.

Moreover, the transistor included in the semiconductor device formed by the manufacturing method of the present invention may have a gate planar structure.

It is to be noted that the semiconductor film of the SOI substrate is of almost single crystal. Therefore, variation in orientation is small as compared with a polycrystalline semiconductor film; accordingly, variation in threshold voltage of transistors can be decreased. Moreover, since a crystal grain boundary hardly exists unlike in a polycrystalline semiconductor film, it is possible to suppress leakage current caused by the crystal grain boundary and to achieve reduction of power consumption of a semiconductor device. In a polycrystalline semiconductor film obtained by laser crystallization, a surface of the semiconductor film tends to have a projection (ridge) in reflection of distribution of energy density of a beam spot. In contrast, the semiconductor film of the SOI substrate does not need laser irradiation or the semiconductor film may be irradiated with a laser beam of low energy density to such a degree that defects in the semiconductor film caused by the attachment can recover. Accordingly, the semiconductor film of the SOI substrate has a much flatter surface than the polycrystalline semiconductor film obtained by laser crystallization and the gate insulating film formed over the semiconductor film of the SOI substrate can therefore has a thickness as small as 5 nm to 50 nm. Thus, high on-current can be obtained while suppressing gate voltage. In the case of using a polycrystalline semiconductor film obtained by laser crystallization, it is necessary to arrange the semiconductor films of transistors along a direction to which a laser beam is scanned, in order to achieve higher mobility. However, the semiconductor film of the SOI substrate is not restricted in arrangement; therefore, limit on design of semiconductor devices is reduced.

This embodiment mode can be implemented in combination with any of the above embodiment modes as appropriate.

Embodiment 1

In this embodiment, a procedure of forming a plurality of semiconductor devices by using one base substrate is described.

Figure 8A:
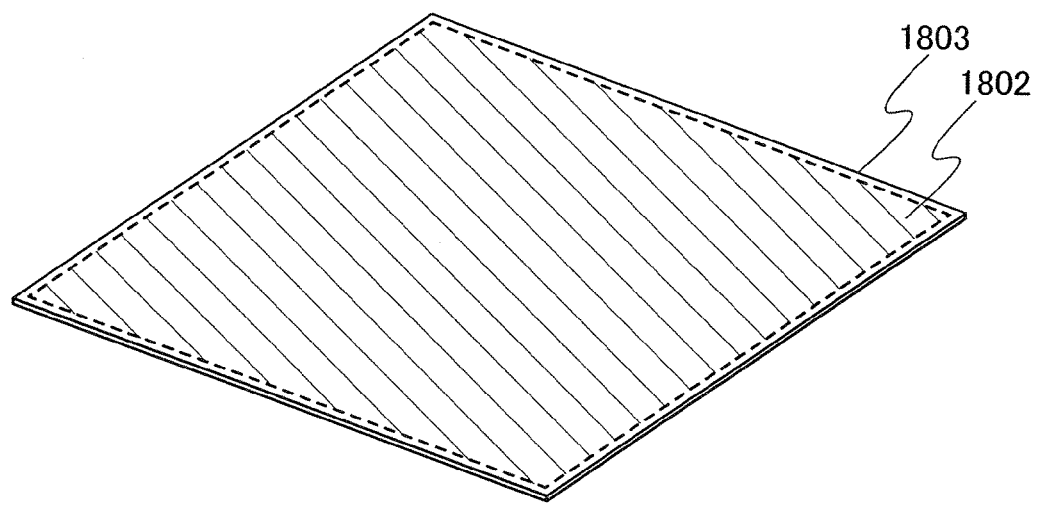
FIGS. 8A and 8B are perspective views showing a method of manufacturing a semiconductor device of the present invention.

FIG. 8A shows an external appearance of a base substrate 1803 over which an insulating film 1802 is formed.

Figure 8B:
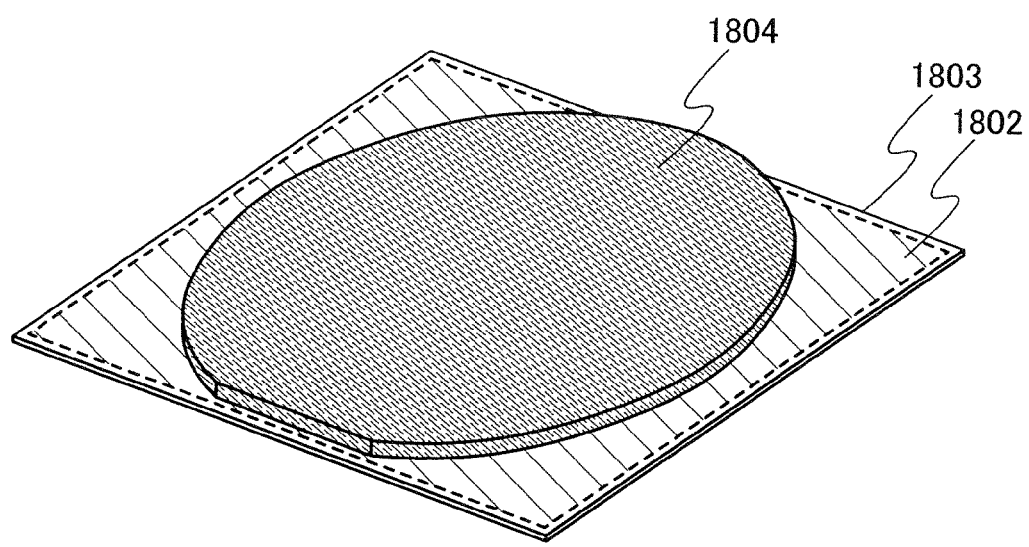

Next, as shown in FIG. 8B, a bonding substrate 1804 having an insulating film formed over its surface is attached to the base substrate 1803 in such a manner that the insulating film formed over the bonding substrate 1804 is in contact with the insulating film 1802.

Figure 9A:
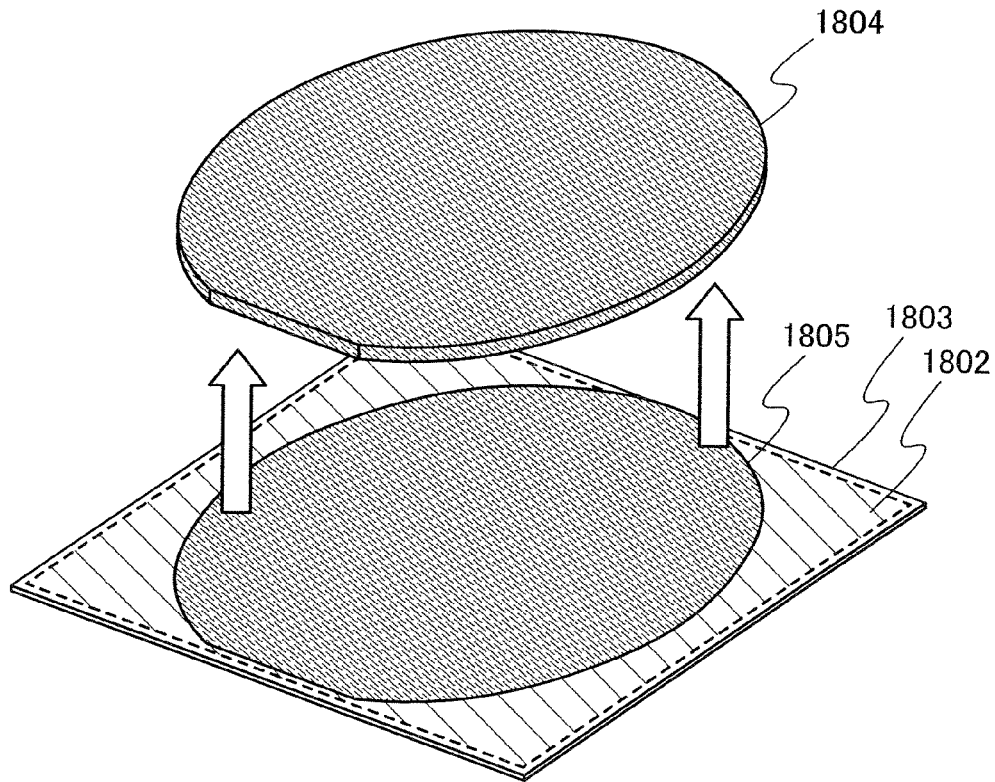
FIGS. 9A and 9B are perspective views showing a method of manufacturing a semiconductor device of the present invention.
Figure 9B:
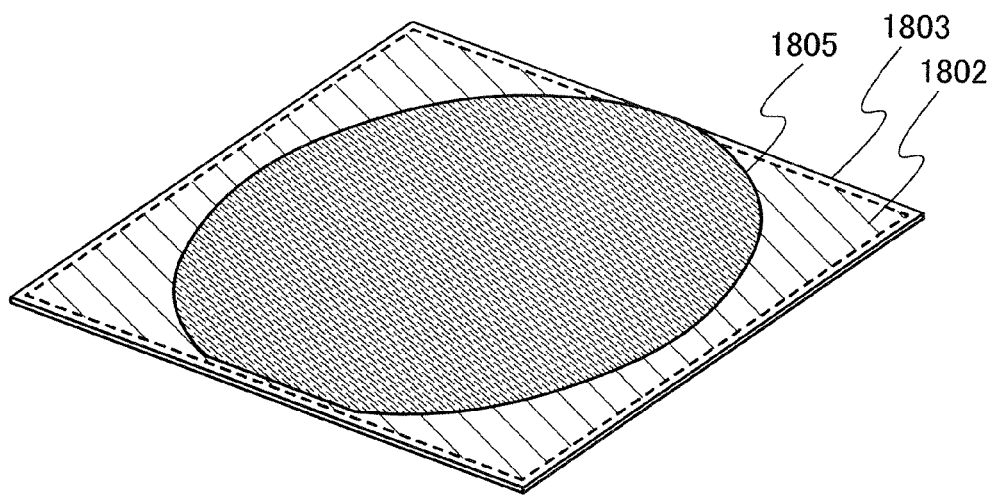

Then, the bonding substrate 1804 is separated as shown in FIG. 9A, whereby a semiconductor film 1805 which used to serve as a part of the bonding substrate 1804 is formed over the base substrate 1803 as shown in FIG. 9B.

Figure 10:
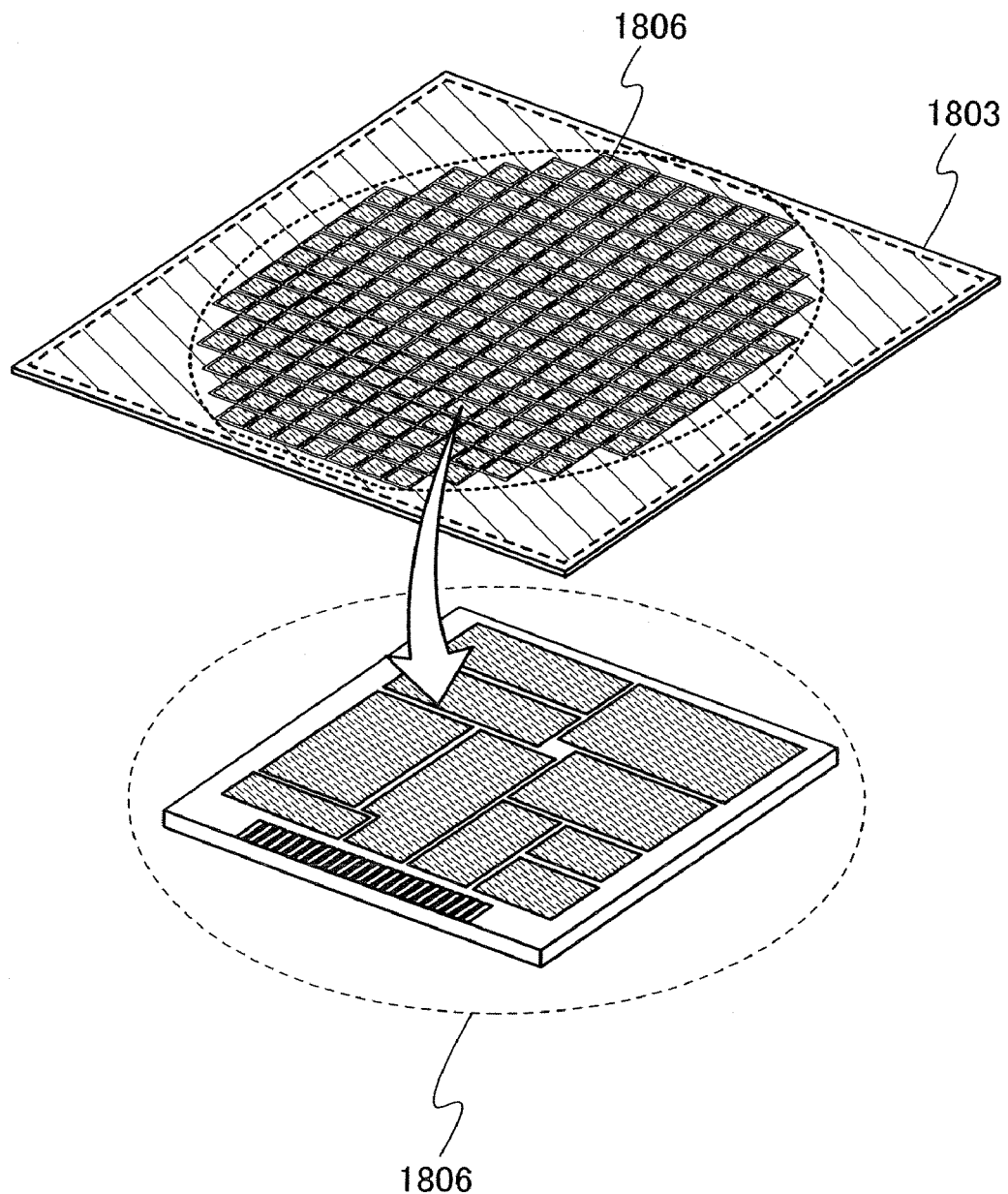
FIG. 10 is a perspective view showing a method of manufacturing a semiconductor device of the present invention.

Next, a plurality of semiconductor devices 1806 is formed using the semiconductor film 1805 formed over the base substrate 1803 as shown in FIG. 10, and the semiconductor devices 1806 including the base substrate 1803 are cut by dicing or the like. By the above structure, the plurality of semiconductor devices 1806 can be formed.

Although this embodiment describes the case of attaching one base substrate 1803 to one bonding substrate 1804, the present invention is not limited to this structure. A plurality of bonding substrates 1804 may be attached to one base substrate 1803.

This embodiment can be implemented in combination with any of the above embodiment modes as appropriate.

Embodiment 2

In this embodiment, an inverter is described as an example of specific structures of a variety of circuits in a semiconductor device formed by the manufacturing method of the present invention. A circuit diagram of the inverter is shown in FIG. 11A, and a top view of the inverter of FIG. 10A is shown in FIG. 11B, as an example.

Figure 11A:
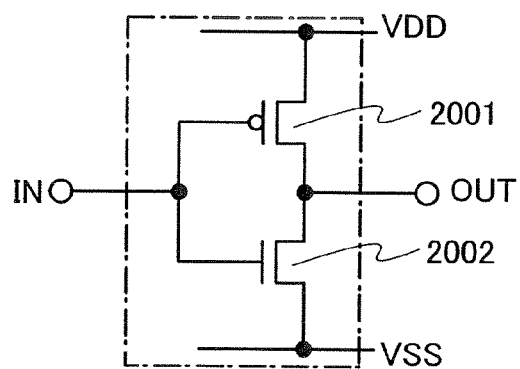
FIGS. 11A and 11B each show a structure of an inverter formed by a method of manufacturing a semiconductor device of the present invention.

The inverter shown in FIG. 11A has a p-channel transistor 2001 and an n-channel transistor 2002. The transistor 2001 and the transistor 2002 are connected in series. In specific, a drain of the transistor 2001 is connected to a drain of the transistor 2002. The potentials of the drain of the transistor 2001 and the drain of the transistor 2002 are applied to an output terminal OUT.

Further, a gate of the transistor 2001 is connected to a gate of the transistor 2002. The potential of a signal input to an input terminal IN is applied to the gate of the transistor 2001 and the gate of the transistor 2002. A high-level voltage VDD is applied to a source of the transistor 2001 while a low-level voltage VSS is applied to a source of the transistor 2002.

Figure 11B:
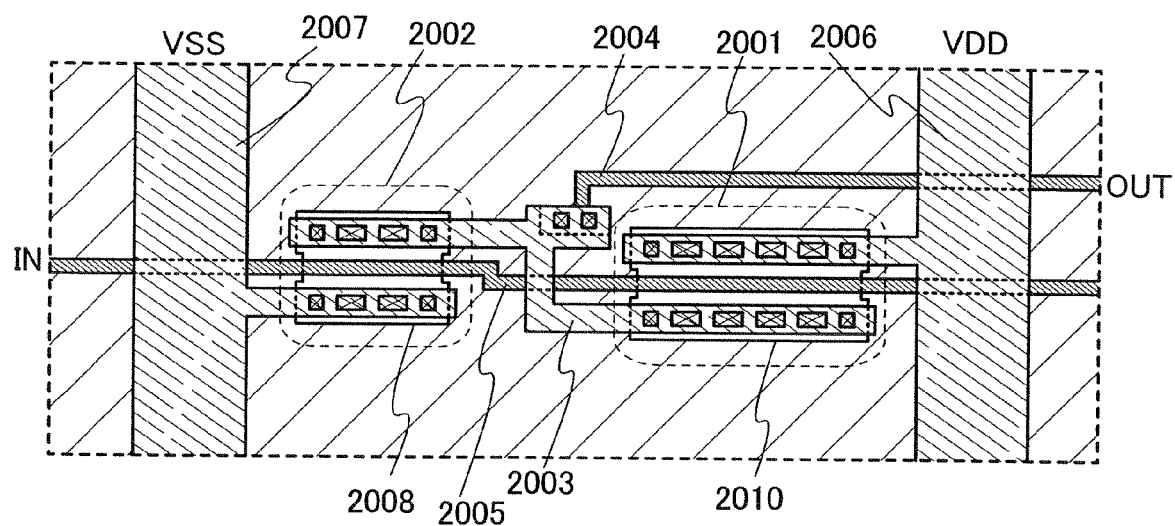

Specifically, in the inverter shown in FIG. 11B, the drain of the transistor 2001 and the drain of the transistor 2002 are electrically connected to each other through a wiring 2003. The wiring 2003 is connected to a wiring 2004. Therefore, the potentials of the drain of the transistor 2001 and the drain of the transistor 2002 are applied as the potential of the output terminal OUT to a circuit in the next stage through the wiring 2003 and the wiring 2004.

Further, in the inverter shown in FIG. 11B, the transistor 2001 has a semiconductor film 2010 and the transistor 2002 has a semiconductor film 2008. Moreover, parts of a wiring 2005 function as the gate of the transistor 2001 and the gate of the transistor 2002. The potential applied to the wiring 2005 is applied to the gate of the transistor 2001 and the gate of the transistor 2002 as the potential of the input terminal IN. The voltage VDD is applied to the source of the transistor 2001 through a wiring 2006 and the voltage VSS is applied to the source of the transistor 2002 through a wiring 2007.

This embodiment can be implemented in combination with any of the above embodiment modes and embodiment as appropriate.

Embodiment 3

In this embodiment, a NAND is described as an example of specific structures of a variety of circuits in a semiconductor device formed by the manufacturing method of the present invention. A circuit diagram of the NAND is shown in FIG. 12A, and a top view of the NAND of FIG. 12A is shown in FIG. 12B, as an example.

Figure 12A:
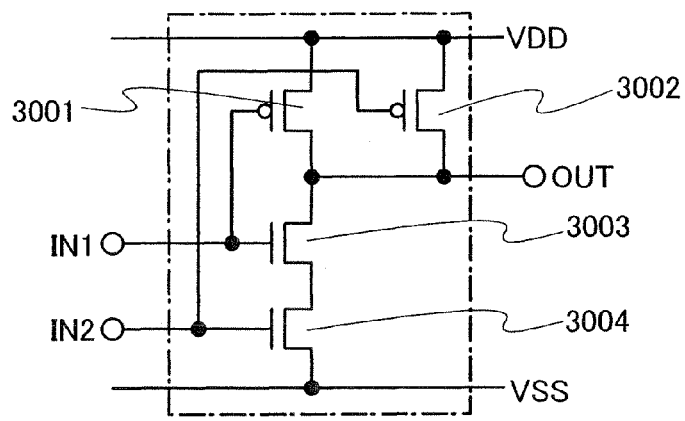
FIGS. 12A and 12B each show a structure of a NAND formed by a method of manufacturing a semiconductor device of the present invention.

The NAND shown in FIG. 12A has a p-channel transistor 3001, a p-channel transistor 3002, an n-channel transistor 3003, and an n-channel transistor 3004. The transistor 3001, the transistor 3003, and the transistor 3004 are connected in series in that order. Meanwhile, the transistor 3001 and the transistor 3002 are connected in parallel.

In specific, a high-level voltage VDD is applied to one of a source and a drain of the transistor 3001, and the other of the source and the drain is connected to an output terminal OUT. The high-level voltage VDD is applied to one of a source and a drain of the transistor 3002 and the other is connected to the output terminal OUT. A low-level voltage VSS is applied to one of a source and a drain of the transistor 3004. One of a source and a drain of the transistor 3003 is connected to the output terminal OUT. Further, the other of the source and the drain of the transistor 3003 is connected to the other of the source and the drain of the transistor 3004. The potential of an input terminal IN1 is applied to a gate of the transistor 3001 and a gate of the transistor 3003. Further, the potential of an input terminal IN2 is applied to a gate of the transistor 3002 and a gate of the transistor 3004.

Figure 12B:
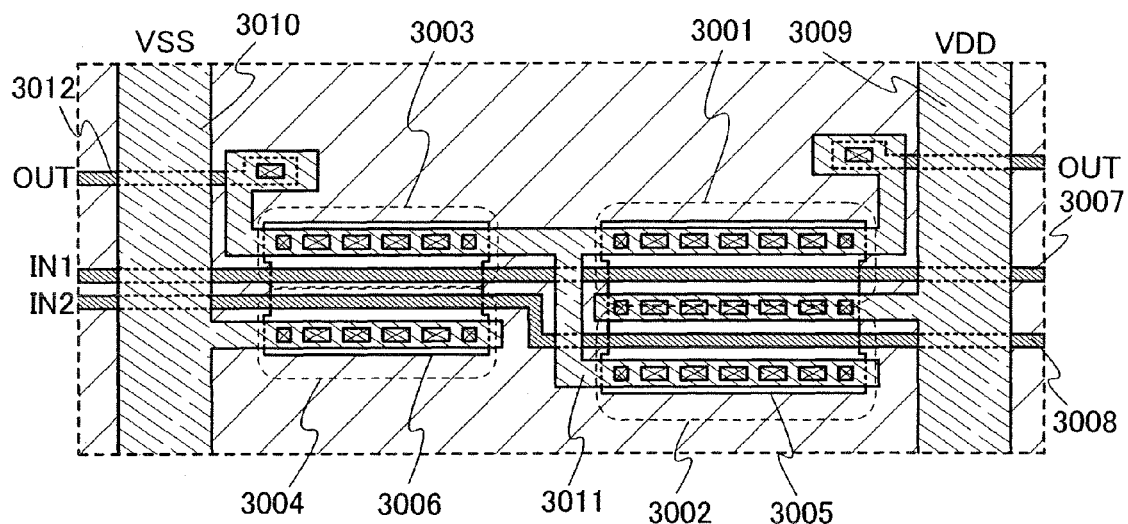

In the NAND shown in FIG. 12B, the parallel connected transistors 3001 and 3002 share the semiconductor film 3005. Moreover, the serially connected transistors 3003 and 3004 share the semiconductor film 3006. Further, parts of a wiring 3007 function as the gate of the transistor 3001 and the gate of the transistor 3003. Thus, the potential applied to the wiring 3007 is applied to the gate of the transistor 3001 and the gate of the transistor 3003 as the potential of the input terminal IN1. Parts of a wiring 3008 function as the gate of the transistor 3002 and the gate of the transistor 3004. The potential applied to the wiring 3008 is applied to the gate of the transistor 3002 and the gate of the transistor 3004 as the potential of the input terminal IN2.

The high-level voltage VDD is applied to one of the source and the drain of the transistor 3001 and one of the source and the drain of the transistor 3002 through a wiring 3009. Further, the low-level voltage VSS is applied to one of the source and the drain of the transistor 3004 through a wiring 3010. The potentials of the other of the source and the drain of the transistor 3001, the other of the source and the drain of the transistor 3002, and one of the source and the drain of the transistor 3003 are applied as the potential of the output terminal OUT to a circuit in the next stage through a wiring 3011 and a wiring 3012.

This embodiment can be implemented in combination with any of the above embodiment modes or embodiments as appropriate.

Embodiment 4

Figure 13A:
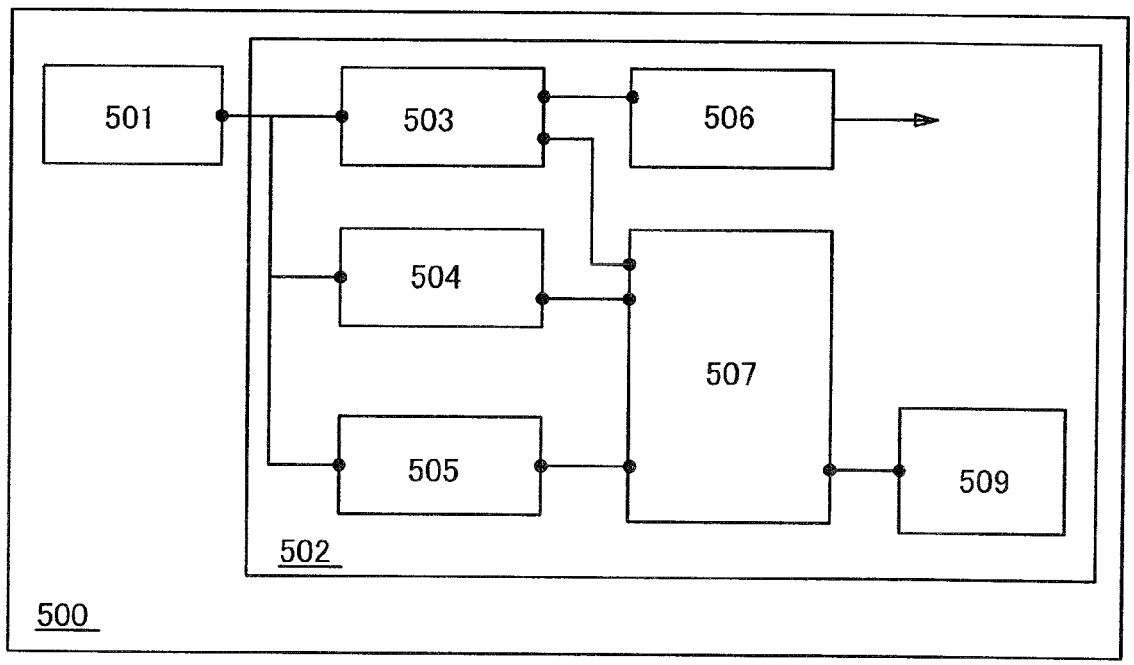
FIG. 13A is a block diagram of an RF tag and FIG. 13B is a block diagram of a CPU, both formed by a method of manufacturing a semiconductor device of the present invention.

In this embodiment, a structure of an RF tag which is one of semiconductor devices formed by the manufacturing method of the present invention will be described. FIG. 13A is a block diagram illustrating one mode of an RF tag of the present invention. In FIG. 13A, an RF tag 500 includes an antenna 501 and an integrated circuit 502. The integrated circuit 502 includes a power supply circuit 503, a demodulation circuit 504, a modulation circuit 505, a regulator 506, a control circuit 507, and a memory 509.

When an electric wave is transmitted from an interrogator, the electric wave is converted into an AC voltage in the antenna 501. In the power supply circuit 503, the AC voltage from the antenna 501 is rectified to generate a voltage for a power supply. The voltage for a power supply, which is generated in the power supply circuit 503, is fed to the control circuit 507 and the regulator 506. After stabilizing the voltage for a power supply from the power supply circuit 503 or after adjusting the level thereof, the regulator 506 supplies the voltage to circuits such as the demodulation circuit 504, the modulation circuit 505, the control circuit 507, or the memory 509 in the integrated circuit 502.

The demodulation circuit 504 demodulates an AC signal received by the antenna 501 and then outputs the signal to the control circuit 507 of a next stage. The control circuit 507 performs arithmetic processing in accordance with the signal input from the demodulation circuit 504 and generates another signal. In the above arithmetic processing, the memory 509 can be used as a primary cache memory or a secondary cache memory. Further, the control circuit 507 analyzes the signal input from the demodulation circuit 504, and information in the memory 509 is output or the content of an instruction in the memory 509 is stored in accordance with the content of an instruction transmitted from the interrogator. The signal output from the control circuit 507 is encoded and transmitted to the modulation circuit 505. The modulation circuit 505 modulates an electric wave received by the antenna 501 in accordance with the signal. The electric wave modulated in the modulation circuit 505 is received by the interrogator. Thus, data output from the RF tag 500 can be known.

In this manner, communication between the RF tag 500 and the interrogator is performed by modulating an electric wave used as a carrier (a carrier wave). As the carrier, there are electric waves with frequencies of 125 kHz, 13.56 MHz, 950 MHz, and the like, which are various depending on the standard. A modulation method includes a variety of methods such as amplitude modulation, frequency modulation, and phase modulation, depending on the standard; however, any modulation may be employed as long as it is based on the standard.

Further, signal transmission methods can be classified into a variety of kinds such as an electromagnetic coupling method, an electromagnetic induction method, a microwave method, and the like, depending on the wavelength of a carrier.

The memory 509 may be either a nonvolatile memory or a volatile memory. As the memory 509, an SRAM, a DRAM, a flash memory, an EEPROM, an FeRAM, or the like can be used.

In this embodiment, a structure of the RF tag 500 including the antenna 501 is described; however, the RF tag of the present invention does not necessarily include an antenna. In addition, the RF tag illustrated in FIG. 13A may be provided with an oscillation circuit or a secondary battery.

In FIG. 13A, a structure of the RF tag including only one antenna is described; however, the present invention is not limited to this structure. Two antennas, an antenna for receiving electric power and an antenna for receiving a signal, may be provided. If only one antenna is provided, in the case where both supply of electric power and transmission of a signal are performed with an electric wave of 950 MHz for example, there is a possibility that a large amount of electric power is transmitted to a distance and thus reception of other wireless devices is interfered. Therefore, it is desirable that electric power be supplied over a short distance with electric waves, the frequency of which has been reduced; however, a communication distance inevitably gets short in this case. On the other hand, if two antennas are provided, the frequency of an electric wave for supplying electric power and the frequency of an electric wave for transmitting a signal can be separately used. For example, in the case of transmitting electric power, an electric wave with a frequency of 13.56 MHz and a magnetic field are used, and in the case of transmitting a signal, an electric wave with a frequency of 950 MHz and an electric field are used. Antennas are separately used depending on functions as described above; thus, electric power can be supplied for communication only over a short distance and a signal can be transmitted even over a long distance.

In the RF tag which is one of semiconductor devices formed by the manufacturing method of the present invention, the integrated circuit 502 can be formed using a substrate having an insulating surface or a single crystal semiconductor layer (an SOI layer) which is bonded onto an insulating substrate; therefore, not only faster processing speed but also lower power consumption can be achieved. Moreover, the amount of impurities mixing in the semiconductor film can be suppressed; therefore, it is possible to prevent the impurities from causing decrease in reliability and electrical characteristics of transistors, such as variation in threshold voltage and increase in leakage current.

This embodiment can be implemented in combination with any of the above embodiment modes or embodiments as appropriate.

Next, a structure of a CPU (central processing unit) which is one of semiconductor devices formed by the manufacturing method of the present invention is described.

Figure 13B:
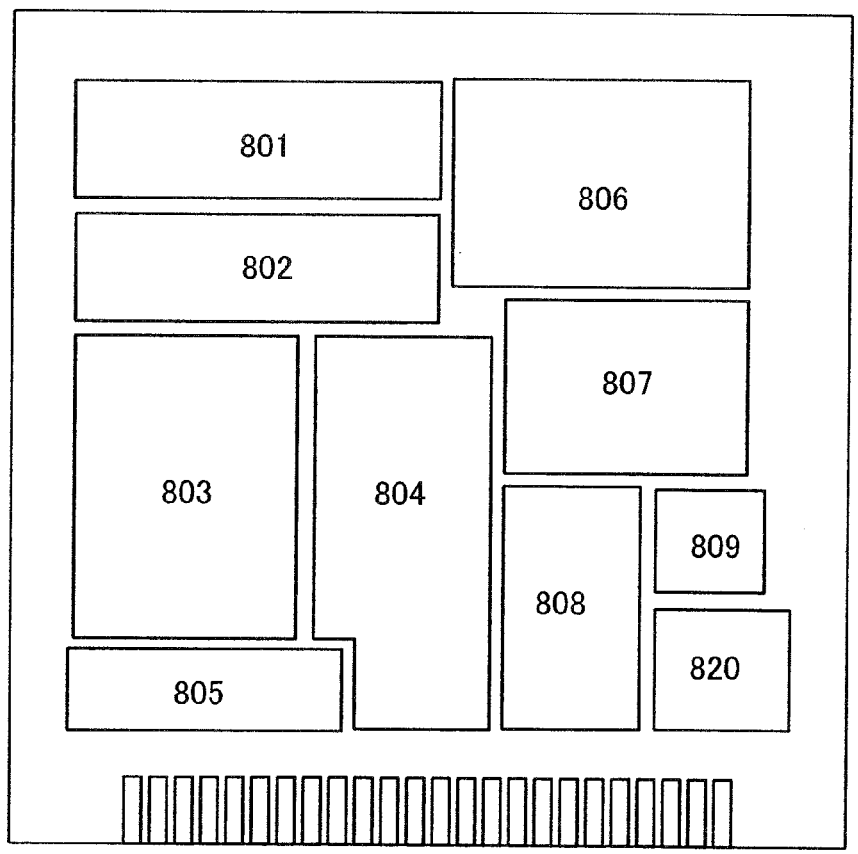

FIG. 13B is a block diagram illustrating a structure of the CPU of this embodiment. A CPU shown in FIG. 13B mainly includes an arithmetic logic unit (ALU) 801, an ALU controller 802, an instruction decoder 803, an interrupt controller 804, a timing controller 805, a register 806, a register controller 807, a bus interface (bus I/F) 808, a memory 809, and a memory interface 820, over a substrate 800. The memory 809 and the memory interface 820 may be provided over another chip. Needless to say, the CPU shown in FIG. 13B is just an example which shows the structure thereof that has been simplified. In fact, the CPU has a variety of structures depending on its intended purpose.

An instruction input to the CPU through the bus interface 808 is decoded in the instruction decoder 803, and then input to the ALU controller 802, the interrupt controller 804, the register controller 807, and the timing controller 805. The ALU controller 802, the interrupt controller 804, the register controller 807, and the timing controller 805 conduct various controls based on the decoded instruction. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-mentioned circuits.

The integrated circuit in the CPU which is one of semiconductor devices formed by the manufacturing method of the present invention can be formed using a substrate having an insulating surface or a single crystal semiconductor layer (SOI layer) which is bonded onto an insulating substrate; therefore, not only faster processing speed but also lower power consumption can be achieved. Moreover, the amount of impurities mixing in the semiconductor film can be suppressed; therefore, it is possible to prevent the impurities from causing decrease in reliability and electrical characteristics of transistors, such as variation in threshold voltage and increase in leakage current in the CPU which is completed finally.

This embodiment can be implemented in combination with any of the above embodiment modes or embodiments as appropriate.

Embodiment 5

In this embodiment, a structure of an active matrix semiconductor display device will be described, which is one of semiconductor devices manufactured in accordance with the present invention.

In an active matrix light-emitting device, each pixel is provided with a light-emitting element which corresponds to a display element. Since a light-emitting element emits light by itself, its visibility is high and a backlight which a liquid crystal display device requires is not necessary. Moreover, the light-emitting element is suitable for a thinner device and has no limitation of viewing angle. Although a light-emitting device using an organic light-emitting diode (OLED) which is a kind of light-emitting element is described in this embodiment, the semiconductor display device manufactured in accordance with the present invention may be a light-emitting device using another light-emitting element.

The OLED includes an anode layer, a cathode layer, and a layer containing a material from which luminescence (electroluminescence) can be obtained (hereinafter, this layer is referred to as an electroluminescent layer) by application of an electric field. As electroluminescence, there are luminescence (fluorescence) at the time of returning to a ground state from a singlet-excited state and luminescence (phosphorescence) at the time of returning to a ground state from a triplet-excited state. In a light-emitting device of the present invention, one of or both fluorescence and phosphorescence may be used.

Figure 14A:
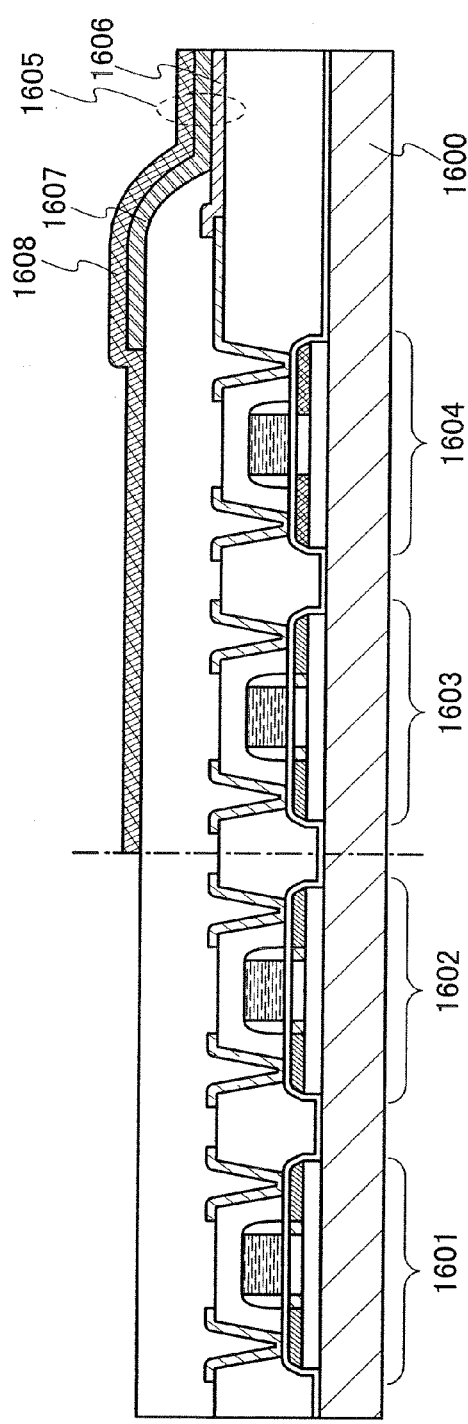
FIG. 14A is a cross sectional view of a light-emitting device and 14B is a cross sectional view of a liquid crystal display device, both formed by a manufacturing method of the present invention.

FIG. 14A is a cross-sectional view of a light-emitting device of this embodiment. The light-emitting device shown in FIG. 14A has a transistor 1601 and a transistor 1602 which are used for a driver circuit, a driver transistor 1604 which is used for a pixel, and a switching transistor 1603 over an element substrate 1600. The light-emitting device shown in FIG. 14A has a light-emitting element 1605 in a pixel over the element substrate 1600.

The light-emitting element 1605 has a pixel electrode 1606, an electroluminescent layer 1607, and a counter electrode 1608. One of the pixel electrode 1606 and the counter electrode 1608 is an anode, and the other is a cathode.

The anode can be formed of a light-transmitting oxide conductive material such as indium tin oxide including silicon oxide (ITSO), indium tin oxide (ITO), zinc oxide (ZnO), indium zinc oxide (IZO), or gallium-doped zinc oxide (GZO). As an alternative to the above light-transmitting oxide conductive materials, the anode may be formed using, for example, a single-layer film containing one or more of titanium nitride, zirconium nitride, Ti, W, Ni, Pt, Cr, Ag, Al, or the like; a stacked-layer structure of a titanium nitride film and a film containing aluminum as its main component; or a three-layer structure of a titanium nitride film, a film containing aluminum as its main component, and a titanium nitride film. In a case where the anode is formed of a material other than the light-transmitting oxide conductive material and light is extracted from the anode side, the anode is formed to a thickness such that light transmits therethrough (preferably about 5 nm to 30 nm).

A conductive composition including a conductive macromolecule (also referred to as a conductive polymer) can be used for the anode. A conductive film which uses the conductive composition and serves as an anode preferably has a sheet resistance of 10000 Ω/square or less and a light transmittance of 70% or more at a wavelength of 550 nm. Further, it is preferable that a conductive macromolecule included in a conductive composition have resistance of 0.1 Ω·cm or less.

As the conductive macromolecule, so-called π-electron conjugated conductive macromolecule can be used. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the aforementioned conductive macromolecules may be used alone as the conductive composition for the anode. Alternatively, any of the aforementioned conductive macromolecules can be used with an organic resin added thereto to adjust film characteristics such as the uniformity of the film thickness of the conductive composition or the film strength of the conductive composition.

The organic resin may be a thermosetting resin, a thermoplastic resin, or a photocurable resin as long as the organic resin is compatible with the conductive macromolecule or the organic resin can be mixed and dispersed into the conductive macromolecule. For example, a polyester-based resin such as poly(ethylene terephthalate), poly(butylene terephthalate), or poly(ethylene naphthalate); a polyimide-based resin such as polyimide or polyamide imide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinylchloride; an epoxy resin; a xylene resin; an aramid resin; a polyurethane-based resin; a polyurea-based resin; a melamine resin; a phenol-based resin; polyether; an acrylic-based resin; or a copolymer thereof can be used.

Further, the conductive composition may be doped with an acceptor dopant or a donor dopant so that oxidation-reduction potential of a conjugated electron in a conjugated conductive macromolecule may be changed in order to adjust the conductivity of the conductive composition.

As the acceptor dopant, a halogen compound, Lewis acid, proton acid, an organic cyano compound, an organometallic compound, or the like can be used. Examples of a halogen compound are chlorine, bromine, iodine, iodine chloride, iodine bromide, iodine fluoride, and the like. As examples of a Lewis acid, phosphorus pentafluoride, arsenic pentafluoride, antimony pentafluoride, boron trifluoride, boron trichloride, and boron tribromide can be given. As examples of the proton acid, inorganic acid such as hydrochloric acid, sulfuric acid, nitric acid, phosphoric acid, fluoroboric acid, hydrofluoric acid, or perchloric acid and organic acid such as organic carboxylic acid, or organic sulfonic acid can be given. As the organic carboxylic acid and the organic sulfonic acid, carboxylic acid compounds or sulfonic acid compounds can be used. As the organic cyano compound, a compound having two or more cyano groups in a conjugated bonding, for example, tetracyanoethylene, tetracyanoethylene oxide, tetracyanobenzene, tetracyanoquinodimethane, or tetracyanoazanaphthalene, are given.

As the donor dopant, there are alkali metal, alkaline-earth metal, a quaternary amine compound, and the like.

A conductive composition is dissolved in water or an organic solvent (e.g., an alcohol-based solvent, a ketone-based solvent, an ester-based solvent, a hydrocarbon-based solvent, or an aromatic-based solvent) and thus a thin film which serves as an anode can be formed by a wet process.

There is no particular limitation on the solvent in which the conductive composition is dissolved, as long as the above-described conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and/or the like.

After the conductive composition is dissolved in a solvent as described above, a film thereof can be formed by a wet process, such as a coating method, a droplet discharging method (also referred to as an inkjet method), or a printing method. The solvent may dried by thermal treatment or may be dried under reduced pressure. When the organic resin is a thermosetting resin, another heat treatment may be performed. When the organic resin is a photocurable resin, light irradiation treatment may be performed.

The cathode can be formed in general by using a metal, an alloy, an electrically conductive compound, or a mixture thereof, each of which has a low work function. Specifically, an alkali metal such as Li or Cs, an alkaline earth metal such as Mg, Ca, or Sr, an alloy containing them (e.g., Mg:Ag or AM:Li), or a rare earth metal such as Yb or Er can be formed as well. Further, by formation of a layer containing a material having a high electron injection property so as to be in contact with the cathode, a normal conductive film formed of aluminum, a light-transmitting oxide conductive material, or the like can be used as well.

The electroluminescent layer 1607 may be formed using a single layer or a stack of plural layers; in each layer, not only an organic material but also an inorganic material may be included. The luminescence in the electroluminescent layer 1607 includes light emission which is obtained in returning from a singlet excited state to the ground state (fluorescence) and light emission which is obtained in returning from a triplet excited state to the ground state (phosphorescence). When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in order over the pixel electrode 1606. Note that in the case where the pixel electrode 1606 corresponds to an anode, the electroluminescent layer 1607 is formed by stacking a hole-injection layer, a hole-transport layer, a light-emitting layer, an electron-transport layer, and an electron-injection layer in this order.

The electroluminescent layer 1607 can be formed by a droplet discharge method even when the electroluminescent layer 1607 is formed using any of a macromolecular weight organic compound, an intermediate molecular weight organic compound (an organic compound which does not have a sublimation property but have a molecular chain length of 10 μm or less), a low molecular weight organic compound, or an inorganic compound. Further, the intermediate molecular weight organic compound, the low molecular weight organic compound, and the inorganic compound may also be formed by a vapor deposition method.

Note that each of the switching transistor 1603 and the driver transistor 1604 may have a multi-gate structure such as a double-gate structure or a triple-gate structure instead of a single-gate structure.

Figure 14B:
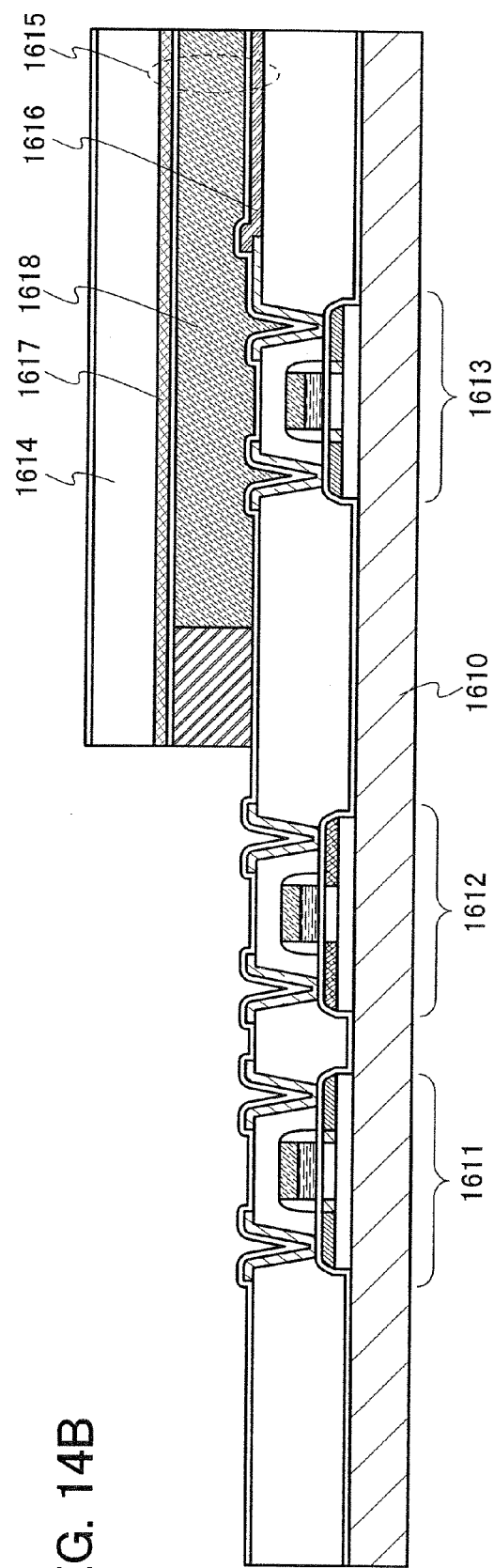

Next, FIG. 14B is a cross-sectional view of a liquid crystal display device of this embodiment. The liquid crystal display device illustrated in FIG. 14B includes a transistor 1611 and a transistor 1612 which are used in a driver circuit, and a transistor 1613 functioning as a switching element in a pixel, over an element substrate 1610. In addition, the liquid crystal display device illustrated in FIG. 14B includes a liquid crystal cell 1615 between the element substrate 1610 and a counter substrate 1614.

The liquid crystal cell 1615 has a pixel electrode 1616 formed over the element substrate 1610, a counter electrode 1617 formed at the counter substrate 1614, and a liquid crystal 1618 provided between the pixel electrode 1616 and the counter electrode 1617. The pixel electrode 1616 can be formed using, for example, indium tin oxide containing silicon oxide (ITSO), indium tin oxide (ITO), zinc oxide (ZnO), indium zinc oxide (IZO), gallium-doped zinc oxide (GZO), or the like.

This embodiment can be implemented in combination with any of the above embodiment modes or embodiments as appropriate.

Embodiment 6

As electronic appliances which can use the semiconductor devices formed by the manufacturing method of the present invention, cellular phones, portable game consoles, electronic book readers, cameras such as video cameras or digital still cameras, goggle displays (head mounted displays), navigation systems, sound playback devices (e.g., car audio components or audio component sets), laptop computers, image playback devices provided with recording media (typically, a device for playing a recording medium such as a digital versatile disc (DVD) and having a display for displaying the image), and the like can be given. Specific examples of such electronic appliances are shown in FIGS. 15A to 15C.

Figure 15A:
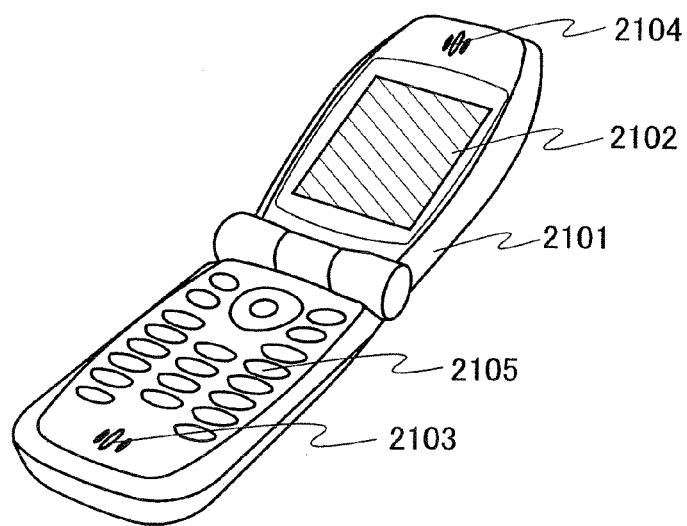
FIGS. 15A to 15C show electronic appliances each using a semiconductor device formed by a manufacturing method of the present invention.

FIG. 15A shows a cellular phone which includes a main body 2101, a display portion 2102, an audio input portion 2103, an audio output portion 2104, and operation keys 2105. By using the semiconductor device formed by the manufacturing method of the present invention for the display portion 2102 or for another signal processing circuit, a cellular phone which has high reliability can be obtained.

Figure 15B:
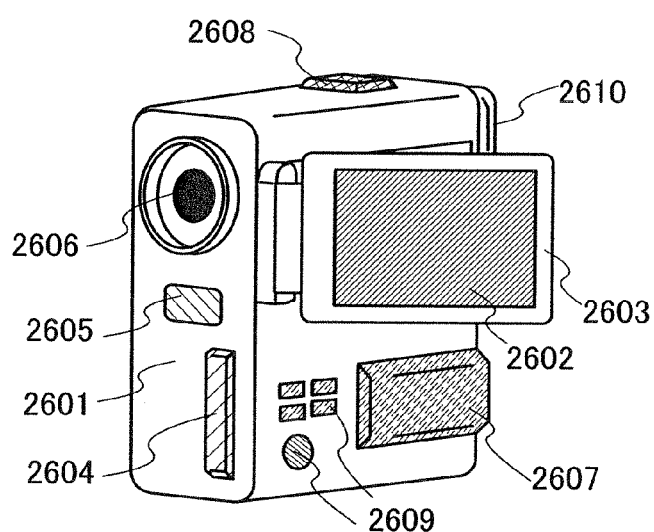

FIG. 15B shows a video camera which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the semiconductor device formed by the manufacturing method of the present invention for the display portion 2602 or for another signal processing circuit, a video camera which has high reliability can be obtained.

Figure 15C:
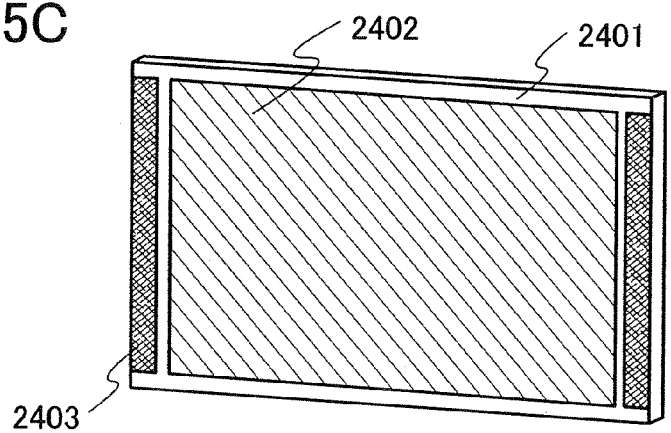

FIG. 15C shows an image display device which includes a housing 2401, a display portion 2402, a speaker portion 2403, and the like. By using the semiconductor device formed by the manufacturing method of the present invention for the display portion 2602 or for another signal processing circuit, an image display device which has high reliability can be obtained. Note that the image display device corresponds to all image display devices for displaying images, such as those for personal computers, television broadcast reception, and advertisement display.

As described above, the application range of the present invention is very wide and the present invention can be applied to electronic appliances of a variety of fields.

This embodiment can be implemented in combination with any of the above embodiment modes or embodiments as appropriate.

Embodiment 7

This embodiment shows results of evaluating concentration of elements existing on a surface of a silicon wafer in which a fragile layer is formed by an ion doping method.

In this embodiment, first, a silicon wafer was subjected to ozone water treatment and megasonic cleaning as surface treatment, and then to total reflection X ray fluorescence analysis (TXRF). After that, the silicon wafer was subjected to megasonic treatment again and then a fragile layer was formed in the silicon wafer by irradiating the silicon wafer with a hydrogen ion beam by an ion doping method under the condition where the hydrogen flow rate was 50 sccm, the acceleration voltage was 20 kV, and the dosage was $1.5 \times 10^{16}$ ions/cm$^2$. The silicon wafer obtained in this manner was subjected to TXRF again.

TXRF refers to an analysis method in which a substrate is irradiated with an X-ray at an extremely shallow angle and a fluorescent X-ray generated when it is totally reflected is detected. Based on the wavelength of the fluorescent X-ray, the kind of elements on the surface of the substrate can be known. Moreover, based on the intensity of the fluorescent X-ray, the concentration or quantity of the elements can be known.

Figure 16A:
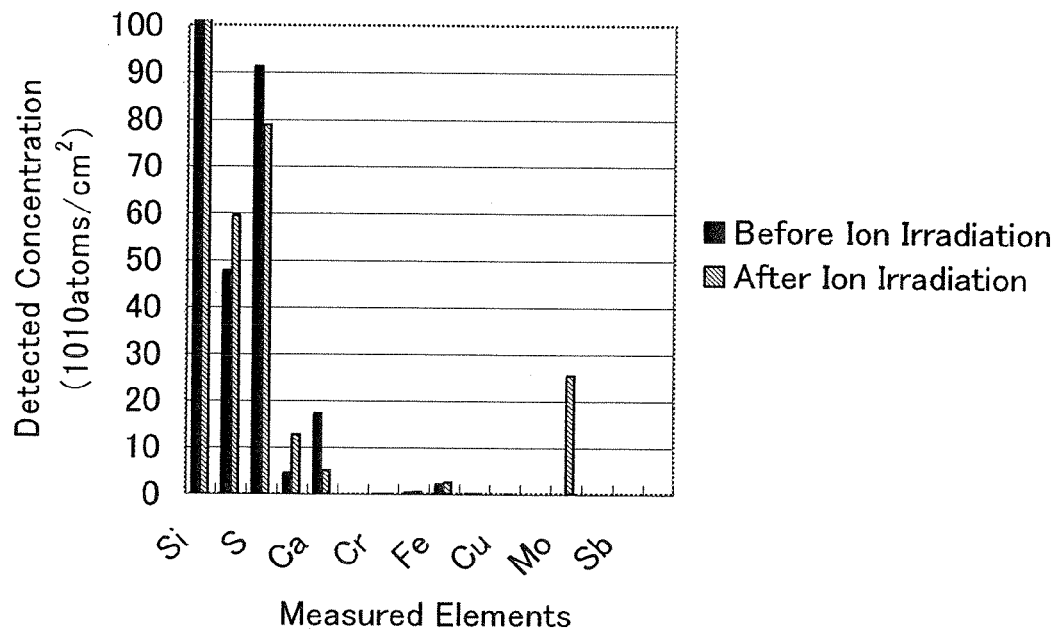
FIGS. 16A and 16B show detected concentration of measured elements on a silicon wafer surface before and after ion irradiation.
Figure 16B:
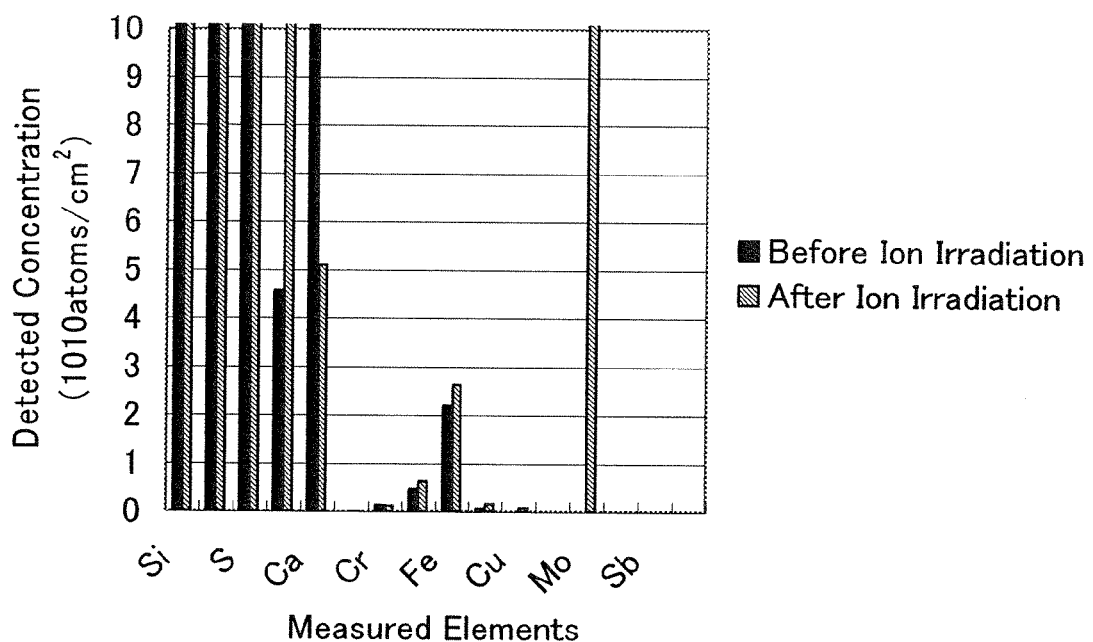

The results of detection of the elements on the surface of the silicon wafer are shown in FIGS. 16A and 16B. FIG. 16A is a graph showing the detected concentration of the elements measured up to a concentration of $100 \times 10^{10}$ atoms/cm$^2$ before and after the ion irradiation and FIG. 16B is a graph showing the detected concentration of the elements measured up to a concentration of $10 \times 10^{10}$ atoms/cm$^2$ before and after the ion irradiation.

It is understood from FIG. 16A that a lot of phosphorus, sulfur, chlorine, and molybdenum exist on the silicon wafer after the ion irradiation, in addition to silicon as a constituent element of the silicon wafer. In addition, as indicated by FIG. 16B, calcium, manganese, iron, and the like also exist on the silicon wafer. In comparison between before and after the ion irradiation, sulfur and calcium decrease after the ion irradiation; on the other hand, phosphorus, chlorine, manganese, iron, and molybdenum increase after the ion irradiation. In particular, molybdenum, which hardly exists before the ion irradiation, increases to exist at a concentration of $25.45 \times 10^{10}$ atoms/cm$^2$ after the ion irradiation.

As thus described, a number of impurity elements exist on the surface of the silicon wafer in which the fragile layer is formed by an ion doping method. After the ion doping, atoms of phosphorus, chlorine, manganese, iron, and the like in addition to molybdenum in particular increase.

This application is based on Japanese Patent Application serial no. 2007-264051 filed with Japan Patent Office on Oct. 10, 2007, the entire contents of which are hereby incorporated by reference.

What is claimed is:

1. A method of manufacturing a semiconductor device comprising:
   forming a fragile layer in a semiconductor substrate by adding ions to the semiconductor substrate;
   removing a region of the semiconductor substrate, the region ranging from a shallower position than the fragile layer to a surface of the semiconductor substrate; and
   attaching the semiconductor substrate to a base substrate and then separating the semiconductor substrate at the fragile layer, thereby, forming a semiconductor film over the base substrate.

2. The method of manufacturing a semiconductor device according to claim 1, wherein the semiconductor substrate is a single crystal silicon substrate.

3. The method of manufacturing a semiconductor device according to claim 1, wherein the ions are added to the semiconductor substrate by an ion doping method.

4. The method of manufacturing a semiconductor device according to claim 1, wherein the removing step is performed by etching or polishing.

5. The method of manufacturing a semiconductor device according to claim 1, wherein the removed region of the semiconductor substrate is 1 nm to 5 nm.

6. A method of manufacturing a semiconductor device comprising:
   forming a fragile layer in a semiconductor substrate by adding ions to the semiconductor substrate;
   removing a region of the semiconductor substrate, the region ranging from a shallower position than the fragile layer to a surface of the semiconductor substrate;
   forming one or more insulating films over a surface of the semiconductor substrate that is exposed by the removing step; and
   attaching the semiconductor substrate to a base substrate with the one or more insulating films interposed therebetween and then separating the semiconductor substrate at the fragile layer, thereby, forming a semiconductor film over the base substrate.

7. The method of manufacturing a semiconductor device according to claim 6, wherein the semiconductor substrate is a single crystal silicon substrate.

8. The method of manufacturing a semiconductor device according to claim 6, wherein the ions are added to the semiconductor substrate by an ion doping method.

9. The method of manufacturing a semiconductor device according to claim 6, wherein the removing step is performed by etching or polishing.

10. The method of manufacturing a semiconductor device according to claim 6, wherein the removed region of the semiconductor substrate is 1 nm to 5 nm.

11. A method of manufacturing a semiconductor device comprising:
    forming an insulating film over a bonding substrate;
    forming a fragile layer in the bonding substrate by adding ions to the bonding substrate through the insulating film;
    removing a region of the insulating film after forming the fragile layer, the region ranging from a surface of the insulating film to a predetermined depth;
    attaching the insulating film directly to a base substrate after removing the region of the insulating film and then separating the bonding substrate at the fragile layer, thereby, forming a semiconductor film over the base substrate.

12. The method of manufacturing a semiconductor device according to claim 11, wherein the bonding substrate is a single crystal silicon substrate.

13. The method of manufacturing a semiconductor device according to claim 11, wherein the ions are added to the bonding substrate by an ion doping method.

14. The method of manufacturing a semiconductor device according to claim 11, wherein the removing step is performed by etching or polishing.

15. The method of manufacturing a semiconductor device according to claim 11, wherein the removed region of the insulating film is 1 nm to 5 nm.

16. A method of manufacturing a semiconductor device comprising:
    forming a first insulating film over a bonding substrate;
    forming a fragile layer in the bonding substrate by adding ions to the bonding substrate through the first insulating film;
    removing a region of the first insulating film after forming the fragile layer, the region ranging from a surface of the first insulating film to a predetermined depth;
    forming a second insulating film by a chemical vapor reaction over a surface of the first insulating film that is exposed by the removing step; and
    attaching the bonding substrate to a base substrate with the first insulating film and the second insulating film interposed therebetween and then separating the bonding substrate at the fragile layer, thereby, forming a semiconductor film over the base substrate.

17. The method of manufacturing a semiconductor device according to claim 16, wherein the bonding substrate is a single crystal silicon substrate.

18. The method of manufacturing a semiconductor device according to claim 16, wherein the ions are added to the bonding substrate by an ion doping method.

19. The method of manufacturing a semiconductor device according to claim 16, wherein the removing step is performed by etching or polishing.

20. The method of manufacturing a semiconductor device according to claim 16, wherein the removed region of the first insulating film is 1 nm to 5 nm.

* * * * *